(12) United States Patent
Ku et al.

(10) Patent No.: US 12,484,213 B2
(45) Date of Patent: Nov. 25, 2025

(54) SEMICONDUCTOR DEVICE

(71) Applicant: Samsung Electronics Co., Ltd., Suwon-si (KR)

(72) Inventors: Byeongjoo Ku, Suwon-si (KR); Keunnam Kim, Suwon-si (KR); Kiseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 299 days.

(21) Appl. No.: 18/144,885

(22) Filed: May 9, 2023

(65) Prior Publication Data

US 2023/0389287 A1  Nov. 30, 2023

(30) Foreign Application Priority Data

May 25, 2022 (KR) ........................ 10-2022-0064254

(51) Int. Cl.
H10B 12/00 (2023.01)
(52) U.S. Cl.
CPC ......... H10B 12/315 (2023.02); H10B 12/482 (2023.02); H10B 12/488 (2023.02); H10B 12/50 (2023.02)
(58) Field of Classification Search
CPC .... H10B 12/315; H10B 12/482; H10B 12/50; H10B 12/488
See application file for complete search history.

(56) References Cited

U.S. PATENT DOCUMENTS

| | | |
|---|---|---|
| 8,324,682 B2 | 12/2012 | Chen et al. |
| 9,041,086 B2 | 5/2015 | Lindholm et al. |
| 9,230,853 B2 | 1/2016 | Yu et al. |
| 10,062,745 B2 | 8/2018 | Ramaswamy |
| 10,607,988 B2 | 3/2020 | Karda et al. |
| 11,127,744 B2 | 9/2021 | Servalli et al. |
| 11,139,302 B2 | 10/2021 | Sukekawa et al. |
| 11,217,588 B2 | 1/2022 | Sukekawa et al. |

(Continued)

FOREIGN PATENT DOCUMENTS

| | | |
|---|---|---|
| TW | 202201734 A | 1/2022 |
| TW | 202213743 A | 4/2022 |

OTHER PUBLICATIONS

Office Action dated Apr. 18, 2024 for corresponding application No. TW 112119166.

Primary Examiner — Richard A Booth
(74) Attorney, Agent, or Firm — Muir Patent Law, PLLC

(57) ABSTRACT

A semiconductor device includes: a substrate including a cell array area, a periphery circuit area, and an interface area; bit lines arranged in the cell array area and extending in a first horizontal direction; a mold insulating layer arranged on the bit lines and including openings extending in a second horizontal direction; channel layers respectively arranged on the bit lines in each of the openings; word lines respectively arranged on the channel layers and extending in the second horizontal direction from the cell array area to the interface area, the word lines including a first word line on a first sidewall of each opening of the mold insulating layer and a second word line on a second sidewall of the opening; and a trimming insulating block arranged in the interface area and connected to an end of the first word line and an end of the second word line.

20 Claims, 30 Drawing Sheets

(56) References Cited

U.S. PATENT DOCUMENTS

| | | |
|---|---|---|
| 11,257,821 B1 | 2/2022 | Lee |
| 11,950,423 B2 | 4/2024 | Lee et al. |
| 2009/0010036 A1* | 1/2009 | Kato .................... G11C 5/025 |
| | | 365/51 |
| 2012/0061742 A1* | 3/2012 | Maekawa .............. H10B 41/30 |
| | | 257/314 |
| 2021/0408049 A1 | 12/2021 | Young et al. |

* cited by examiner

SEMICONDUCTOR DEVICE

CROSS-REFERENCE TO RELATED APPLICATION

This application is based on and claims priority under 35 U.S.C. § 119 to Korean Patent Application No. 10-2022-0064254, filed on May 25, 2022, in the Korean Intellectual Property Office, the disclosure of which is incorporated by reference herein in its entirety.

BACKGROUND

The inventive concept relates to a semiconductor device, and more particularly, to a semiconductor device including a capacitor structure.

As semiconductor devices are downscaled, the size of a dynamic random access memory (DRAM) device has been also reduced. In a DRAM device having a 1T-1C structure, in which one capacitor is connected to one transistor, there is an issue that a leakage current through a channel region increases as the size of the DRAM device decreases. To reduce the leakage current, a transistor using an oxide semiconductor material as a channel layer has been proposed.

SUMMARY

The inventive concept provides a semiconductor device capable of reducing a leakage current.

According to an aspect of the inventive concept, there is provided a semiconductor device including: a substrate including a cell array area, a periphery circuit area, and an interface area between the cell array area and the periphery circuit area; a plurality of bit lines arranged in the cell array area of the substrate and extending in a first horizontal direction; a mold insulating layer arranged on the plurality of bit lines, the mold insulating layer including a plurality of openings extending lengthwise in a second horizontal direction; a plurality of channel layers respectively arranged on the plurality of bit lines in each of the plurality of openings of the mold insulating layer; a plurality of word lines respectively arranged on the plurality of channel layers and extending lengthwise in the second horizontal direction from the cell array area to the interface area, the plurality of word lines including a first word line arranged on a first sidewall of each opening of the mold insulating layer and a second word line arranged on a second sidewall of the opening; and a trimming insulating block arranged in the interface area of the substrate and connected to an end of the first word line and an end of the second word line.

According to another aspect of the inventive concept, there is provided a semiconductor device including: a substrate including a cell array area, a periphery circuit area, and an interface area between the cell array area and the periphery circuit area; a plurality of bit lines arranged in the cell array area of the substrate and extending in a first horizontal direction; a plurality of channel layers respectively arranged on the plurality of bit lines, the plurality of channel layers including a first vertical extension portion and a second vertical extension portion spaced apart from each other in the first horizontal direction, and a horizontal extension portion connected to a bottom portion of the first vertical extension portion and a bottom portion of the second vertical extension portion; a plurality of word lines respectively arranged on the plurality of channel layers and extending lengthwise from the cell array area to the interface area in the second horizontal direction, the plurality of word lines including a first word line arranged on a sidewall of the first vertical extension portion of the plurality of channel layers and a second word line arranged on a sidewall of the second vertical extension portion of the plurality of channel layers; and a trimming insulating block arranged in the interface area of the substrate and connected to an end of the first word line and an end of the second word line.

According to another aspect of the inventive concept, there is provided a semiconductor device including: a substrate including a cell array area, a periphery circuit area, and an interface area between the cell array area and the periphery circuit area; a periphery circuit arranged in the cell array area of the substrate; a plurality of bit lines arranged in the cell array area of the substrate and extending in a first horizontal direction; a mold insulating layer arranged on the plurality of bit lines, the mold insulating layer including a plurality of openings extending in a second horizontal direction; a plurality of channel layers respectively arranged on the plurality of bit lines in each of the plurality of openings of the mold insulating layer; a plurality of word lines arranged on the plurality of channel layers and extending in the second horizontal direction from the cell array area to the interface area, the plurality of word lines including a first word line arranged on a first sidewall of each opening of the mold insulating layer and a second word line arranged on a second sidewall of the opening of the mold insulating layer; a trimming insulating block arranged in the interface area of the substrate and connected to an end of the first word line and an end of the second word line; landing pads respectively arranged on the plurality of channel layers in the cell array area; word line contacts arranged on end portions of the plurality of word lines in the interface area; and a routing wiring line arranged on the word line contact in the interface area, and arranged at a same vertical level as the landing pad.

BRIEF DESCRIPTION OF THE DRAWINGS

Embodiments will be more clearly understood from the following detailed description taken in conjunction with the accompanying drawings in which numbers refer to like elements throughout. In the drawings.

DETAILED DESCRIPTION OF THE EMBODIMENTS

Figure 1:
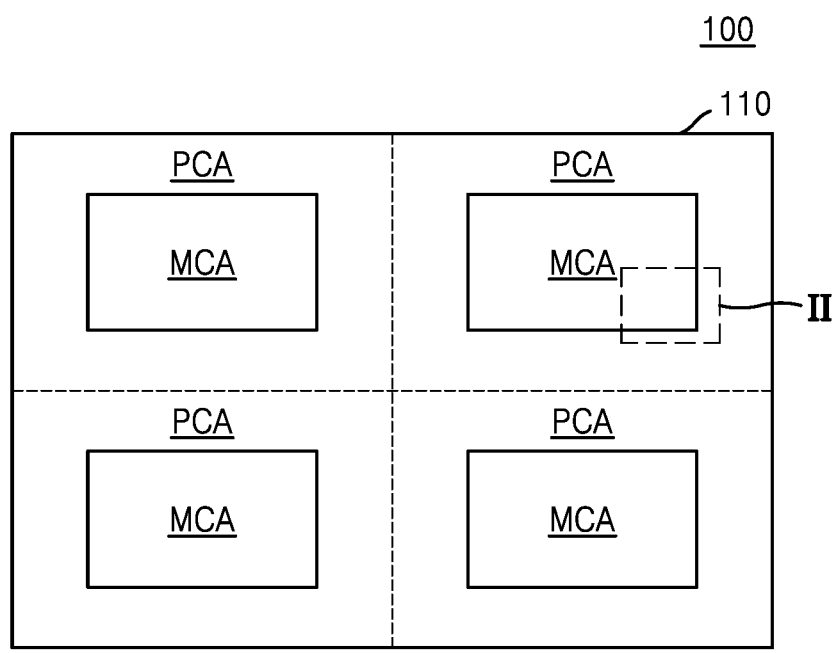
FIG. 1 is a layout diagram of a semiconductor device, according to an example embodiment.
Figure 2:
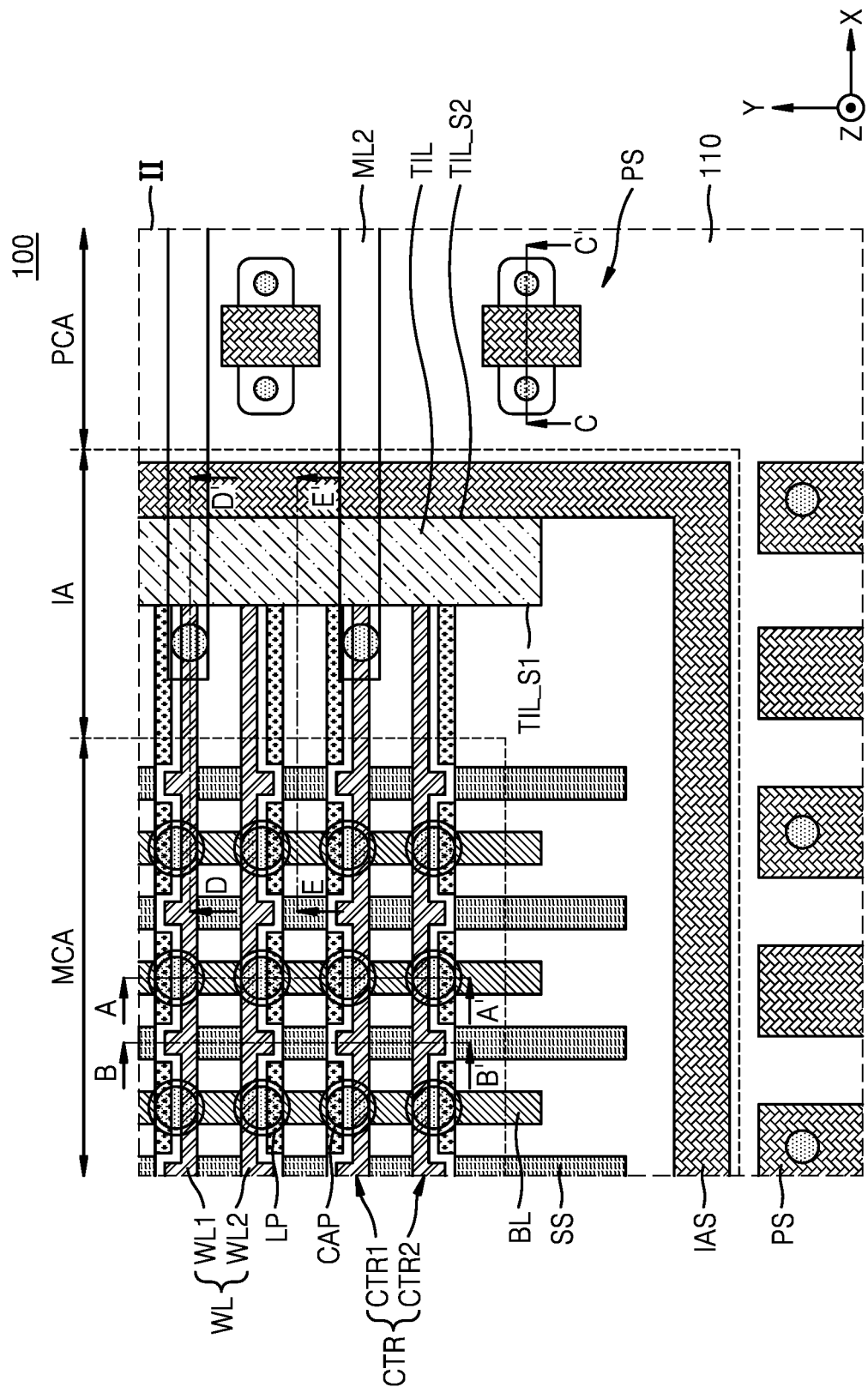
FIG. 2 is an enlarged layout diagram of region II in FIG. 1.
Figure 3:
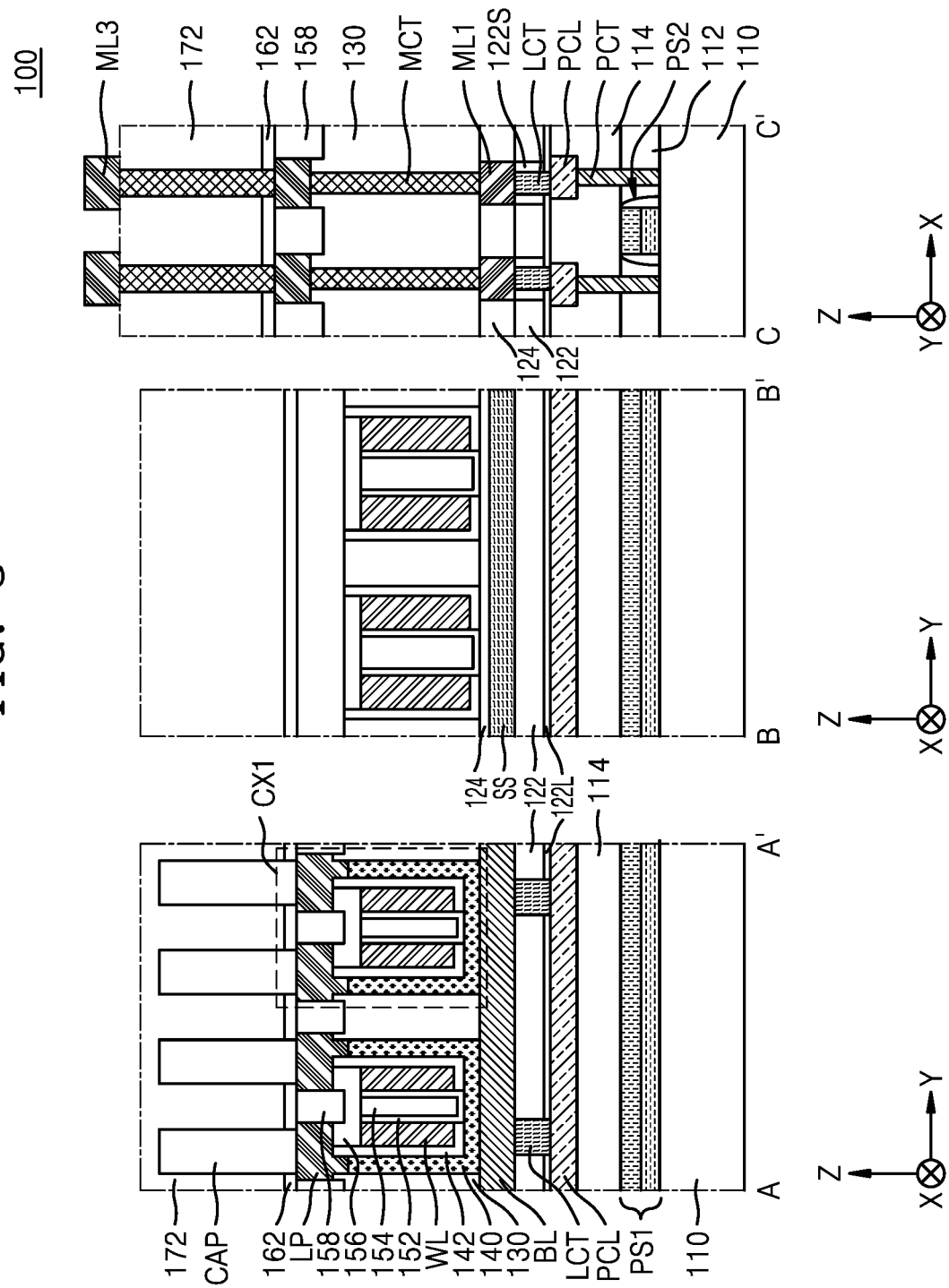
FIG. 3 illustrates cross-sectional views taken along line A-A', line B-B', and line C-C' in FIG. 2.
Figure 4:
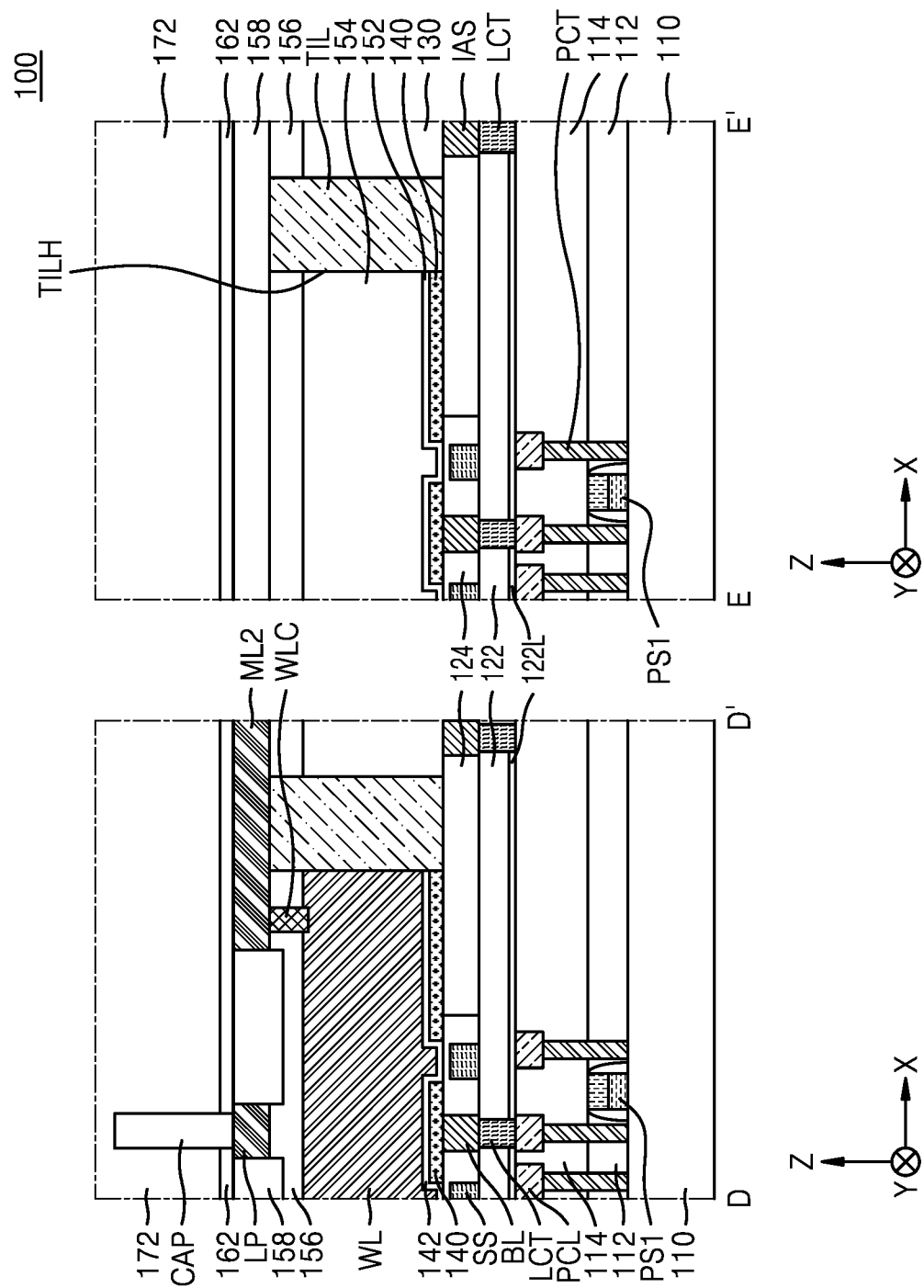
FIG. 4 illustrates cross-sectional views taken along lines D-D' and E-E' in FIG. 2.
Figure 5:
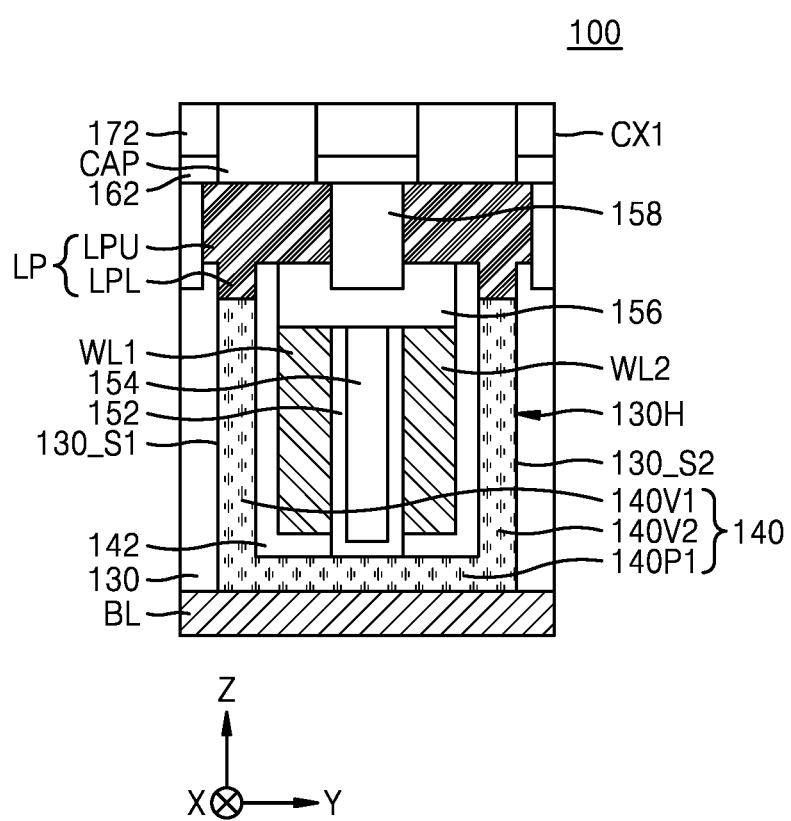
FIG. 5 is an enlarged cross-sectional view of region CX1 in FIG. 3.
Figure 6:
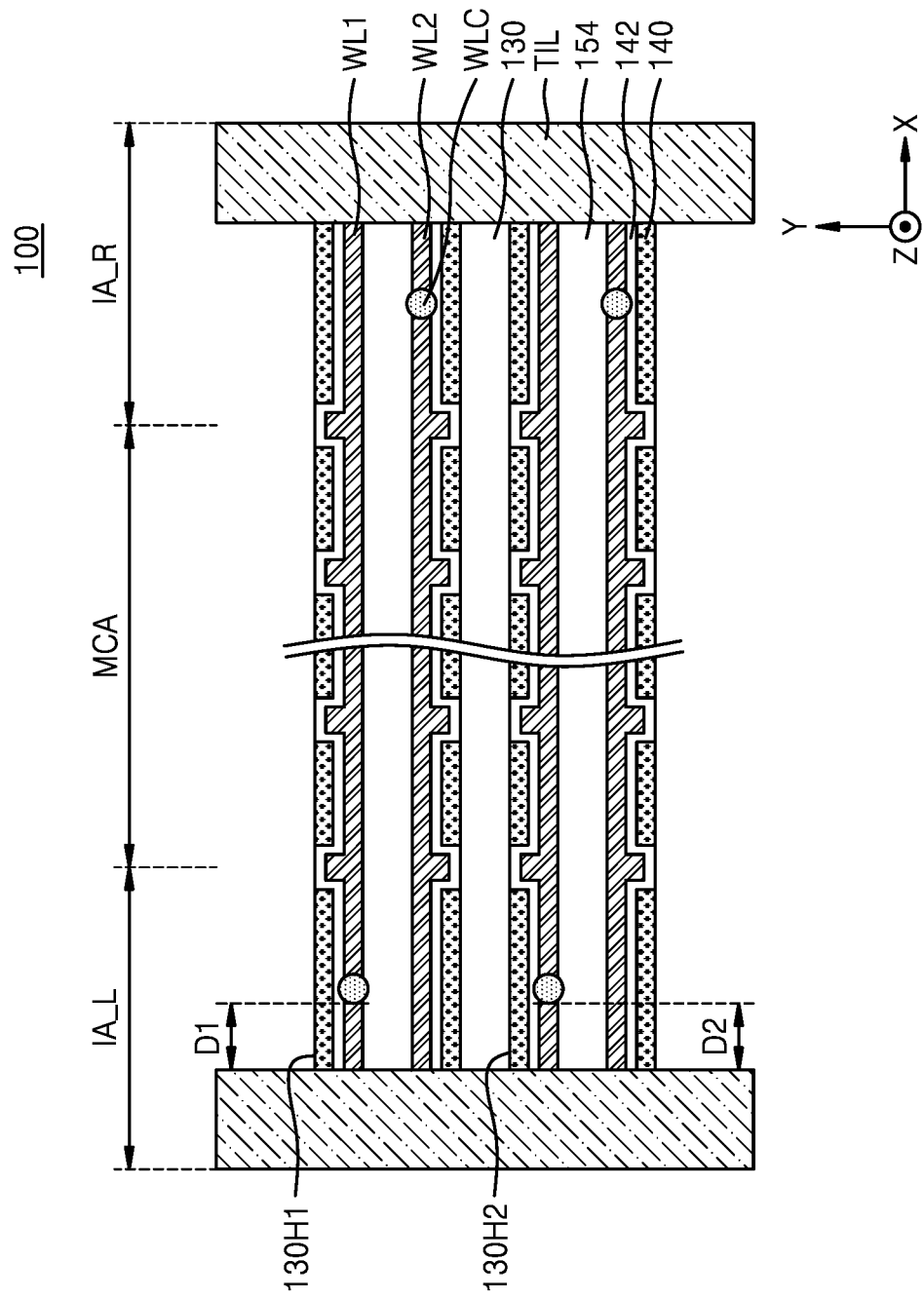
FIGS. 6 to 8 are schematic diagrams illustrating word line contact arrangements of a semiconductor device, according to example embodiments.

FIG. 1 is a layout diagram of a semiconductor device 100 according to an example embodiment. FIG. 2 is an enlarged layout diagram of region II in FIG. 1. FIG. 3 illustrates cross-sectional views taken along line A-A', line B-B', and line C-C' in FIG. 2. FIG. 4 illustrates cross-sectional views taken along lines D-D' and E-E' in FIG. 2. FIG. 5 is an enlarged cross-sectional view of region CX1 in FIG. 3. FIG. 6 is a schematic diagram illustrating an arrangement of a word line contact, according to an example embodiment.

Referring to FIGS. 1 through 8, the semiconductor device 100 may include a cell array area MCA, a periphery circuit area PCA, and an interface area IA. In some embodiments, the cell array area MCA may include a memory cell area of a dynamic random access memory (DRAM) device, and the periphery circuit area PCA may include a core area or a periphery circuit area of the DRAM device. The interface area IA may include a boundary area between the cell array area MCA and the periphery circuit area PCA. For example, the periphery circuit area PCA may include a periphery circuit transistor (not illustrated) for transmitting signals and/or power to a memory cell array included in the cell array area MCA. In embodiments, the periphery circuit transistor (not illustrated) may constitute various circuits, such as a command decoder, a control logic, an address buffer, a row decoder, a column decoder, a sense amplifier, and a data input/output circuit.

As illustrated in FIG. 2, a plurality of word lines WL extending lengthwise in a first horizontal direction X and a plurality of bit lines BL extending lengthwise in a second horizontal direction Y may be arranged in the cell array area MCA of a substrate 110. A plurality of cell transistors CTR may be arranged at intersections of the plurality of word lines WL and the plurality of bit lines BL. A plurality of capacitor structures CAP may be arranged on the plurality of cell transistors CTR, respectively.

The plurality of word lines WL may include a first word line WL1 and a second word line WL2 alternately arranged in the second horizontal direction Y, and the plurality of cell transistors CTR may include first cell transistors CTR1 and second cell transistors CTR2 alternately arranged in the second horizontal direction Y. The first cell transistor CTR1 may be arranged on the first word line WL1, and the second cell transistor CTR2 may be arranged on the second word line WL2.

The first cell transistor CTR1 and the second cell transistor CTR2 may have a mirror symmetry structure with respect to each other. For example, the first cell transistor CTR1 and the second cell transistor CTR2 may have a mirror symmetry structure with respect to a center line, between the first cell transistor CTR1 and the second cell transistor CTR2, extending in the first horizontal direction X.

In embodiments, the width of the plurality of word lines WL may be 1 F, a pitch (that is, a sum of a width and an interval) of the plurality of word lines WL may be 2 F, the width of the plurality of bit lines BL may be 1 F, and a unit area for forming one cell transistor CTR may be 4 $F^2$. Accordingly, because the cell transistor CTR may be a cross-point type requiring a relatively small unit area, the cell transistor CTR may be advantageous for improving the degree of integration of the semiconductor device 100.

The plurality of word lines WL and the plurality of bit lines BL in the cell array area MCA may extend to the interface area IA, and as illustrated in FIG. 2, ends of the plurality of word lines WL and ends of the plurality of bit lines BL may be arranged in the interface area IA.

As illustrated in FIG. 2, a periphery circuit structure PS may be arranged on the substrate 110 in the cell array area MCA and the periphery circuit area PCA, and the plurality of cell transistors CTR and the plurality of capacitor structures CAP may be arranged on the periphery circuit structure PS in the cell array area MCA.

The substrate 110 may include silicon, for example, monocrystalline silicon, polycrystalline silicon, or amorphous silicon. In some other embodiments, the substrate 110 may include at least one of Ge, SiGe, SiC, GaAs, InAs, and InP. In some embodiments, the substrate 110 may include a conductive area, for example, a well doped with impurities, or a structure doped with impurities.

The periphery circuit structure PS may include core circuits PS1 and periphery circuits PS2. For example, the core circuits PS1 may include a sense amplifier arranged in the cell array area MCA, and the periphery circuits PS2 may include a word line driver and/or a control logic arranged in the periphery circuit area PCA. The periphery circuit structure PS may include an NMOS transistor and a PMOS transistor formed on the substrate 110, and may be electrically connected to the bit line BL or the word line WL via, for example, a periphery circuit line PCL and a periphery circuit contact PCT.

A lower insulating layer 112 may cover a sidewall of the periphery circuit structure PS on the substrate 110, and the periphery circuit insulating layer 114 may cover the upper surface of the periphery circuit structure PS and a sidewall of the periphery circuit line PCL on the lower insulating layer 112. For example, the lower insulating layer 112 may contact the sidewall of the periphery circuit structure PS on the substrate 110, and the periphery circuit insulating layer 114 may contact the upper surface of the periphery circuit structure PS and the sidewall of the periphery circuit line PCL on the lower insulating layer 112. The lower insulating layer 112 and the periphery circuit insulating layer 114 may include an oxide layer, a nitride layer, a low dielectric layer, or a combination thereof, and may have a stacked structure of a plurality of insulating layers.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The bit line BL extending in the second horizontal direction Y may be arranged on the periphery circuit insulating layer 114. In embodiments, the bit line BL may include Ti, TiN, Ta, TaN, Mo, Ru, W, WN, Co, Ni, TiSi, TiSiN, WSi, WSiN, TaSi, TiSiN, RuTiN, CoSi, NiSi, polysilicon, or a combination thereof. The bit line BL may be connected to the periphery circuit line PCL via a line contact plug LCT. For example, a lower surface of the bit line BL may contact an upper surface of the line contact plug LCT, and a lower surface of the line contact plug LCT may contact an upper surface of the periphery circuit line PCL.

A lower wiring line ML1 may be arranged at the same level as the bit line BL in the periphery circuit area PCA. The lower wiring line ML1 may be connected to the periphery circuits PS2 via the line contact plug LCT, and may include the same material as a material constituting the bit line BL. For example, a lower surface of the lower wiring line ML1 may contact an upper surface of the line contact plug LCT.

A first insulating layer 122 surrounding the line contact plug LCT may be arranged between the bit line BL and the periphery circuit line PCL and between the lower wiring line ML1 and the periphery circuit line PCL, and a second insulating layer 124 may be arranged between the plurality of bit lines BL. An insulating liner 122S may be arranged between the first insulating layer 122 and side surfaces of the line contact plugs LCT in the periphery circuit area PCA. The insulating liner 122S may contact side surfaces of the line contact plugs LCT in the periphery circuit area PCA, and the first insulating layer 122 may contact the side surface of the line contact plugs LCT in the cell array area MCA. The first insulating layer 122 and the second insulating layer 124 may include an oxide layer, a nitride layer, a low-k dielectric layer, or a combination thereof. An etch stop layer 122L may be arranged under the first insulating layer and on the periphery circuit insulating layer 114.

A shielding structure SS may extend lengthwise in the second horizontal direction Y between the plurality of bit lines BL. The shielding structure SS may include a conductive material, such as metal, and may be surrounded by the second insulating layer 124, and the upper surface of the shielding structure SS may be at a lower level than the upper surface of the plurality of bit lines BL in the vertical direction Z. In embodiments, the shielding structure SS may include a conductive material, and may include an air gap or a void therein, or in other embodiments, air gaps may be defined inside the second insulating layer 124 instead of the shielding structure SS.

A mold insulating layer 130 may be arranged on the bit line BL and the second insulating layer 124. The mold insulating layer 130 may include a plurality of openings 130H. Each of the plurality of openings 130H may extend in the first horizontal direction X, and the upper surface of the bit line BL may be exposed at a bottom portion of each of the plurality of openings 130H. Each of the plurality of openings 130H may include a first sidewall 130_S1 and a second sidewall 130_S2 spaced apart from each other in the second horizontal direction Y, and the first sidewall 130_S1 and the second sidewall 130_S2 may extend in the first horizontal direction X in parallel with each other. The mold insulating layer 130 may include an oxide layer, a nitride layer, a low-k dielectric layer, or a combination thereof.

A plurality of active semiconductor layers 140 may be arranged on inner walls of the plurality of openings 130H. The active semiconductor layer 140 of the first cell transistor CTR1 may be arranged on the first sidewall 130_S1 and the bottom portion of the plurality of openings 130H, and the active semiconductor layer 140 of the second cell transistor CTR2 may be arranged on the second sidewall 130_S2 and the bottom portion of the plurality of openings 130H. The active semiconductor layer 140 of the first cell transistor CTR1 and the active semiconductor layer 140 of the second cell transistor CTR2 may have a mirror symmetry shape with respect to each other.

Each of the plurality of active semiconductor layers 140 may include a first vertical extension portion 140V1, a second vertical extension portion 140V2, and a horizontal extension portion 140P1. For example, the first vertical extension portion 140V1 of one active semiconductor layer 140 may extend in a vertical direction on the first sidewall 130_S1 of the plurality of openings 130H, the horizontal extension portion 140P1 may be connected to the bottom portion of the first vertical extension portion 140V1 and extend in the second horizontal direction Y, and the second vertical extension portion 140V2 may extend on the first sidewall 130_S1 of the plurality of openings 130H1 in a vertical direction. For example, each of the plurality of active semiconductor layers 140 may have a U-shaped vertical cross-section.

The first vertical extension portion 140V1 and a part of the horizontal extension portion 140P1 of one active semiconductor layer 140 may function as a channel region of the first cell transistor CTR1, and the second vertical extension portion 140V2 and a part of the horizontal extension portion 140P1 of the one active semiconductor layer 140 may function as a channel region of the second cell transistor CTR2. A portion of the horizontal extension portion 140P1 may contact the upper surface of the bit line BL, and may function as a contact area shared by the first cell transistor CTR1 and the second cell transistor CTR2.

In embodiments, the plurality of active semiconductor layers 140 may include an oxide semiconductor material. For example, the plurality of active semiconductor layers 140 may include a material having a bandgap greater than that of polysilicon, for example, a material having a bandgap greater than about 1.65 eV. In embodiments, the plurality of active semiconductor layers 140 may include at least one of zinc tin oxide ($Zn_xSn_yO$), indium zinc oxide ($In_xZn_yO$), zinc oxide ($ZnO_x$), indium gallium zinc oxide ($In_xGa_yZn_zO$), indium gallium silicon oxide ($In_xGa_ySi_zO$), indium tungsten oxide ($In_xW_yO$), indium oxide ($In_xO$), tin oxide ($Sn_xO$), titanium oxide ($Ti_xO$), zinc oxynitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), and zirconium zinc tin oxide ($Zr_xZn_ySn_zO$). In other embodiments, the plurality of active semiconductor layers 140 may include a two-dimensional semiconductor material, and the two-dimensional semiconductor material may include graphene, a carbon nanotube, or a combination thereof.

A gate insulating layer 142 may be arranged on inner walls of the plurality of active semiconductor layers 140. For example, the gate insulating layer 142 may be conformally arranged on a sidewall of the first vertical extension portion 140V1, a sidewall of the second vertical extension portion 140V2, and the upper surface of the horizontal extension portion 140P1 of the plurality of active semiconductor layers 140. An outer surface of the gate insulating layer 142 may contact the sidewall of the first vertical extension portion 140V1, the sidewall of the second vertical extension portion 140V2, and the upper surface of the horizontal extension portion 140P1.

In embodiments, the gate insulating layer 142 may include at least one selected from a high-k dielectric material and a ferroelectric material having a dielectric constant higher than that of silicon oxide. In some embodiments, the gate insulating layer 142 may include at least one of hafnium oxide (HfO), hafnium silicate (HfSiO), hafnium oxynitride (HfON), hafnium silicon oxynitride (HfSiON), or lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PbZrTiO), strontium tantalum oxide bismuth (STB), bismuth ferrous oxide (BFO), strontium titanium oxide (SrTiO), yttrium oxide (YO), aluminum oxide (AlO), and lead scandium tantalum oxide (PbScTaO).

The word lines WL may be arranged on the gate insulating layer 142. For example, the word lines WL may contact the gate insulating layer 142. The word lines WL may be arranged on a sidewall of the first vertical extension portion 140V1 of the plurality of active semiconductor layers 140 and on a sidewall of the second vertical extension portion 140V2. The word lines WL may include a first word line WL1 arranged on the sidewall of the first vertical extension portion 140V1 and a second word line WL2 arranged on the sidewall of the second vertical extension portion 140V2. In embodiments, the word line WL may include Ti, TiN, Ta, TaN, Mo, Ru, W, WN, TiSiN, WSiN, polysilicon, or a combination thereof.

An insulating liner 152 may be arranged on the sidewalls of two word lines WL spaced apart from each other in the opening 130H, and a buried insulating layer 154 filling a space between the two word lines WL spaced apart from each other may be arranged on the insulating liner 152. The insulating liner 152 may be conformally arranged on sidewalls, facing each other, of two word lines WL (that is, the first word line WL1 and the second word line WL2), and may have an upper surface arranged coplanar with the word lines WL. For example, the insulating liner 152 may include silicon nitride, and the buried insulating layer 154 may include silicon oxide.

An upper insulating layer 156 may be arranged on the word line WL and the buried insulating layer 154 in the opening 130H. A lower surface of the upper insulating layer 156 may contact upper surfaces of the word line WL and the buried insulating layer 154. The upper surface of the upper insulating layer 156 may be at the same level as the mold insulating layer 130.

A landing pad LP in contact with the upper surface of the active semiconductor layer 140 may be arranged on the upper insulating layer 156. A landing pad insulating layer 158 surrounding the periphery of the landing pad LP may be arranged on the mold insulating layer 130 and the upper insulating layer 156.

As illustrated in FIG. 5, in embodiments, the landing pad LP may have a T-shaped vertical cross-section. The landing pad LP may include an upper portion LPU and a lower portion LPL. The upper portion LPU of the landing pad LP may be referred to as a portion of the landing pad LP arranged at a higher level than the upper surface of the mold insulating layer 130, and the lower portion LPL of the landing pad LP may be referred to as a portion of the landing pad LP arranged between the mold insulating layer 130 and the upper insulating layer 156. In embodiments, the landing pad LP may include Ti, TiN, Ta, TaN, W, WN, TiSiN, WSiN, polysilicon, or a combination thereof.

The bottom surface of the lower portion LPL of the landing pad LP may be in contact with the upper surface of the active semiconductor layer 140, and both sidewalls of the lower portion LPL of the landing pad LP may be aligned with both sidewalls of the active semiconductor layer 140. The bottom surface of the lower part LPL of the landing pad LP may be at a higher level than the upper surface of the word line WL, and a portion of the sidewall of the lower portion LPL of the landing pad LP may be covered by the gate insulating layer 142.

An etching stop layer 162 may be arranged on the landing pad LP and the landing pad insulating layer 158. A capacitor structure CAP may be arranged on the etching stop layer 162, and an interlayer insulating layer 172 may be arranged on the capacitor structure CAP and the etching stop layer 162. In embodiments, the capacitor structure CAP may include a lower electrode (not illustrated), a capacitor dielectric layer (not illustrated), and an upper electrode (not illustrated). However, other types of memory storage components may be arranged in place of the capacitor structure CAP. For example, the memory storage component may include a variable resistance memory component, a phase change memory component, a magnetic memory component, etc.

The interface wiring structure IAS may be arranged at the same vertical level as the bit line BL in the interface area IA. As illustrated in FIG. 2, the interface wiring structure IAS may be arranged to surround the cell array area MCA in a plan view. The interface wiring structure IAS may include the same material as the material constituting the bit line BL, but is not limited thereto.

In the interface area IA, a trimming insulating block TIL may be arranged to be connected to the ends of the plurality of word lines WL. For example, the plurality of word lines WL may extend in the first horizontal direction X to the interface area IA in the cell array area MCA, and the ends of the plurality of word lines WL may be arranged in the interface area IA. For example, the trimming insulating block TIL may include a first sidewall TIL_S1 and a second sidewall TIL_S2 opposite to each other in the first horizontal direction X, and the first sidewall TIL_S1 of the trimming insulating block TIL may contact the plurality of first word lines W1 and the plurality of second word lines W2, which are alternately arranged in the second horizontal direction Y.

The trimming insulating block TIL may extend lengthwise in the second horizontal direction Y, and may be arranged inside a trimming block opening TILH crossing the plurality of openings 130H of the mold insulating layer 130. For example, as illustrated in FIG. 6, the plurality of openings 130H may include a first opening 130H1 and a second opening 130H2 arranged adjacent to each other in the second horizontal direction Y, and the trimming insulating block TIL may be arranged to cross both the first opening 130H1 and the second opening 130H2. The second sidewall TIL_S2 of the trimming insulating block TIL may be in contact with the mold insulating layer 130.

In embodiments, the trimming insulating block TIL may have an upper surface at a level higher than the upper surface of the word line WL in the vertical direction Z, and a bottom surface at a level lower than or equal to the bottom surface of the word line WL in the vertical direction Z. The trimming insulating block TIL may include silicon oxide, silicon nitride, silicon oxynitride, or a combination thereof. In some embodiments, the trimming insulating block TIL may include a single layer of silicon nitride filling the inside of the trimming block opening TILH. In other embodiments, the trimming insulating block TIL may include an insulating liner (not illustrated) arranged on an inner wall of the trimming block opening TILH and a buried insulating layer (not illustrated) filling the inside of the trimming block opening TILH.

In the interface area IA, word line contacts WLC may be arranged on the plurality of word lines WL, and a routing wiring line ML2 may be arranged on the word line contact WLC. In example embodiments, the word line contacts WLC may contact upper surface of the word lines WL, and the routing wiring line ML2 may contact an upper surface of the word line contact WLC. The routing wiring line ML2 may be arranged at the same vertical level as the landing pad LP, and may include the same material as the material constituting the landing pad LP. For example, the thickness in the vertical direction Z of the routing wiring line ML2 may be substantially equal to the thickness in the vertical direction Z of the upper portion LPU of the landing pad LP.

As illustrated in FIG. 6, the word line contact WLC connected to the first word line WL1 arranged in the first opening 130H1 may be arranged in a first interface area IA_L on one side of the cell array area MCA, and the word line contact WLC connected to the second word line WL2 arranged in the first opening 130H1 may be arranged in a second interface area IA_R on the other side of the cell array area MCA. In addition, the word line contact WLC connected to the first word line WL1 arranged in the second opening 130H2 may be arranged in the first horizontal direction X in line with the word line contact WLC connected to the first word line WL1 arranged in the first opening 130H1. For example, a first distance D1 in the first horizontal direction X between the word line contact WLC and the trimming insulating block TIL connected to the first word line WL1 arranged in the first opening 130H1 may be substantially the same as a second distance D2 in the first horizontal direction X between the word line contact WLC and the trimming insulating block TIL connected to the first word line WL1 arranged in the second opening 130H2.

In the periphery circuit area PCA, a contact plug MCT penetrating the mold insulating layer 130 or the interlayer insulating layer 172 and electrically connected to the lower wiring line ML1, and an upper wiring line ML3 connected to the contact plug MCT may be arranged.

According to the semiconductor device 100 according to the embodiments described above, two adjacent word lines WL may be electrically isolated from each other by forming the trimming insulating block TIL in the interface area IA, and thus, the degree of freedom of arrangement of the word line contact WLC with respect to the trimming insulating block TIL may increase. The semiconductor device 100 may have a reduced leakage current and a reduced contact resistance.

Figure 7:
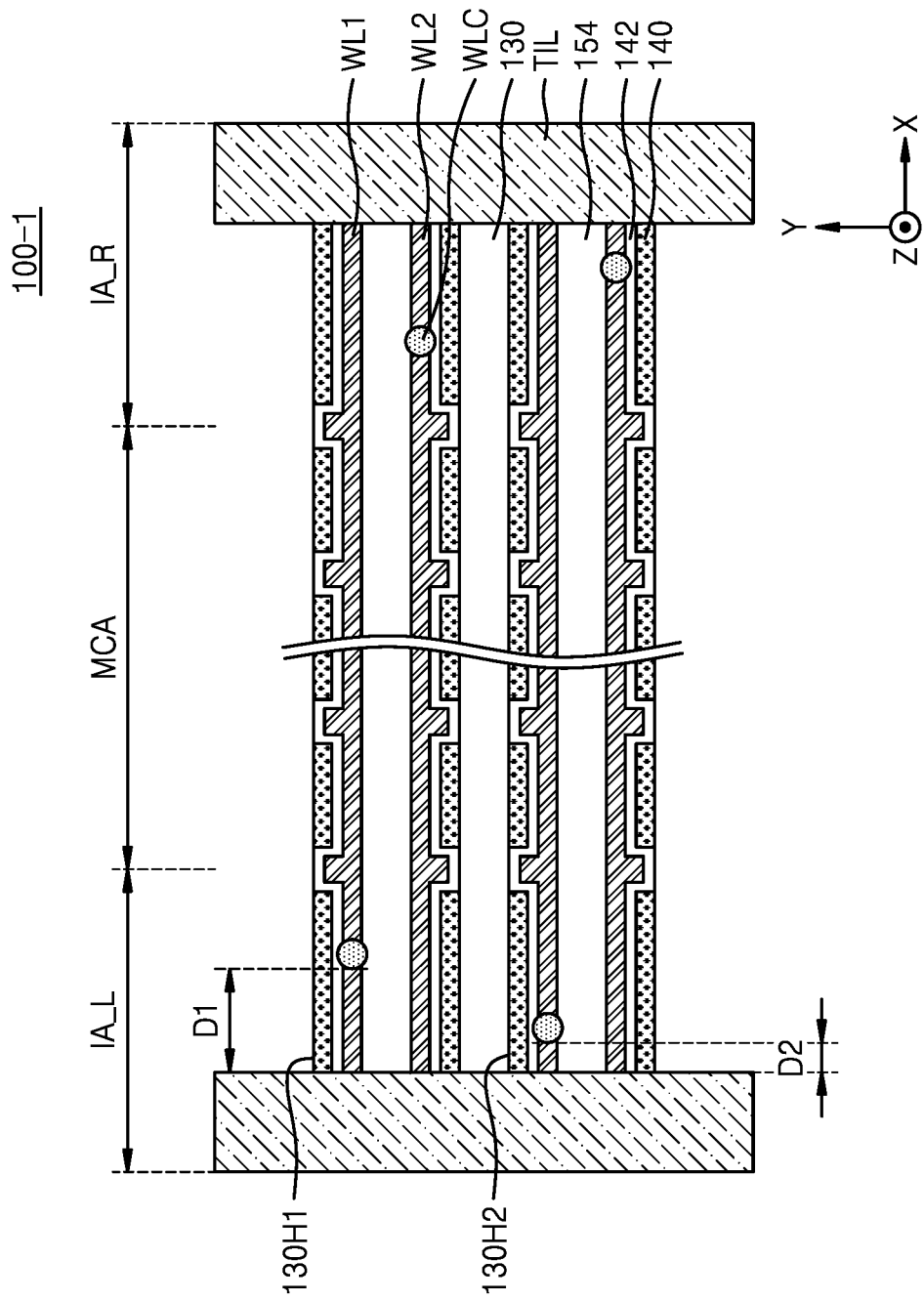

FIG. 7 is a schematic diagram illustrating an arrangement of the word line contact WLC of a semiconductor device 100-1, according to an example embodiment.

Referring to FIG. 7, the word line contact WLC connected to the first word line WL1 arranged in the first opening 130H1 may be arranged in a first interface area IA_L on one side of the cell array area MCA, and the word line contact WLC connected to the second word line WL2 arranged in the first opening 130H1 may be arranged in a second interface area IA_R on the other side of the cell array area MCA.

The word line contact WLC connected to the first word line WL1 arranged in the second opening 130H2 may be arranged offset in the first horizontal direction X from the word line contact WLC connected to the first word line WL1 arranged in the first opening 130H1. For example, the first distance D1 in the first horizontal direction X between the trimming insulating block TIL and the word line contact WLC connected to the first word line WL1 arranged in the first opening 130H1 may be different from the second distance D2 in the first horizontal direction X between the trimming insulating block TIL and the word line contact WLC connected to the first word line WL1 arranged in the second opening 130H2, and for example, as illustrated in FIG. 7, the first distance D1 may be greater than the second distance D2.

Figure 8:
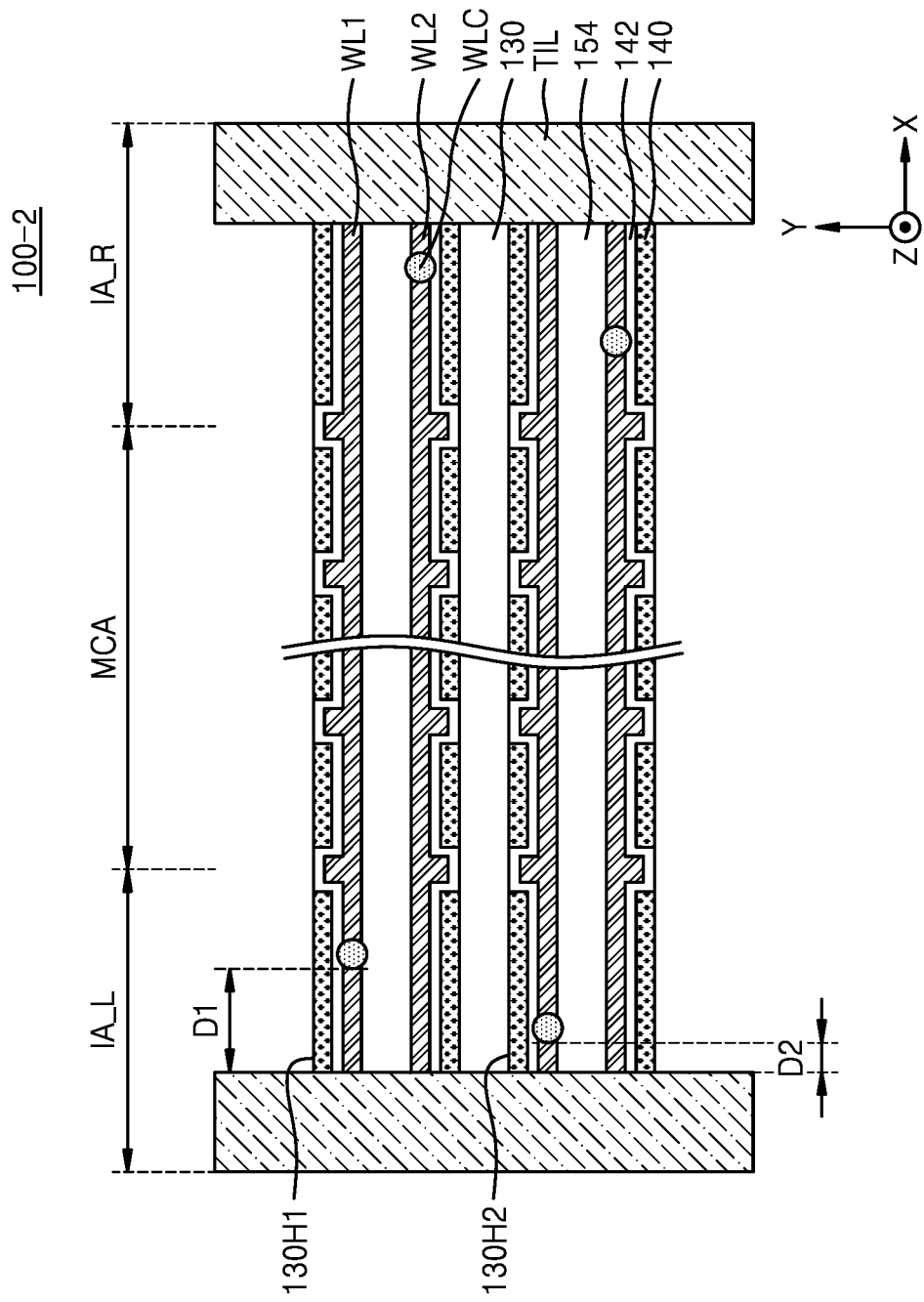

FIG. 8 is a schematic diagram illustrating an arrangement of the word line contact WLC of a semiconductor device 100-2, according to an example embodiment.

Referring to FIG. 8, a distance between the word line contact WLC connected to the first word line WL1 in the first opening 130H1 and the word line contact WLC connected to the second word line WL2 in the first opening 130H1 may be substantially the same as a distance between the word line contact WLC connected to the first word line WL1 in the second opening 130H2 and the word line contact WLC connected to the second word line WL2 in the second opening 130H2.

In addition, the first distance D1 in the first horizontal direction X between the trimming insulating block TIL and the word line contact WLC connected to the first word line WL1 arranged in the first opening 130H1 may be different from the second distance D2 in the first horizontal direction X between the trimming insulating block TIL and the word line contact WLC connected to the first word line WL1 arranged in the second opening 130H2.

Although an example arrangement of the word line contact WLC has been described with reference to FIGS. 6 through 8, the arrangement of the word line contact WLC is not limited to the embodiments described with reference to FIGS. 6 through 8, and may be variously modified.

Figure 9:
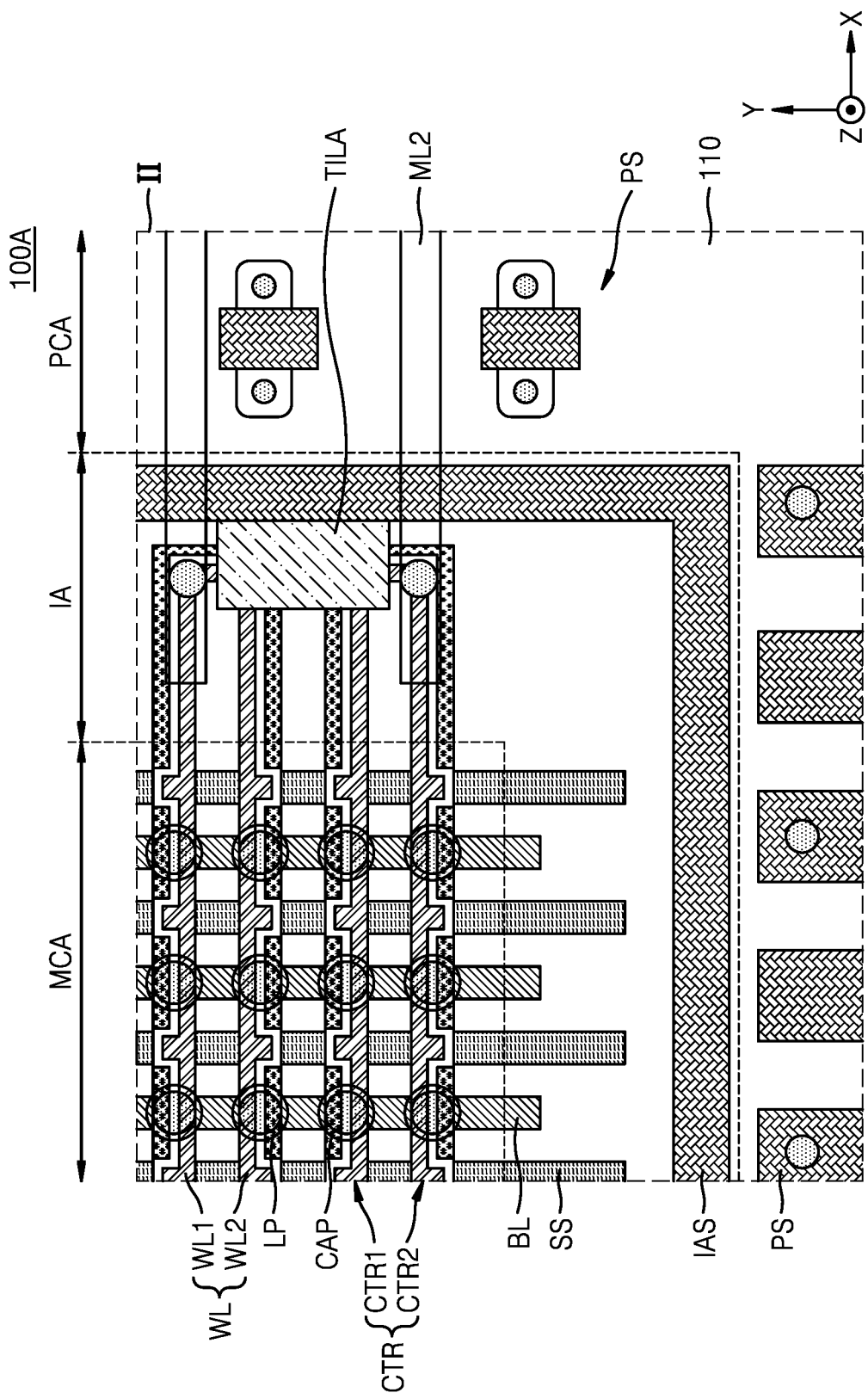
FIG. 9 is a layout diagram of a semiconductor device, according to an example embodiment.
Figure 10:
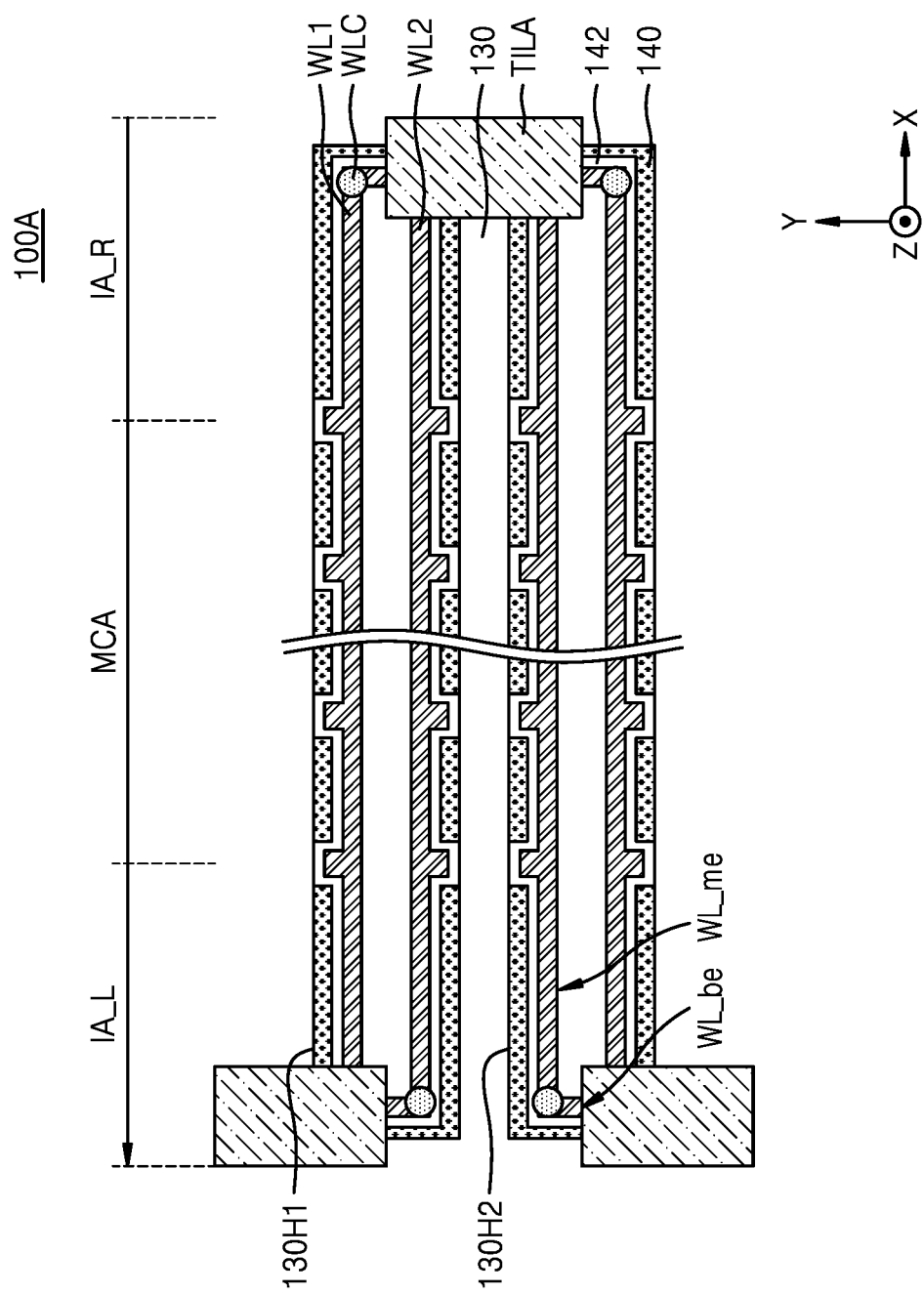
FIGS. 10 and 11 are schematic diagrams illustrating word line contact arrangements of a semiconductor device, according to example embodiments.

FIG. 9 is a layout diagram of a semiconductor device 100A according to an example embodiment. FIG. 10 is a schematic diagram illustrating an arrangement of the word line contact WLC, according to an example embodiment.

Referring to FIGS. 9 and 10, a trimming insulating block TILA may be arranged to vertically overlap a portion of the first opening 130H1 and a portion of the second opening 130H2. For example, the trimming insulating block TILA may extend in the second horizontal direction Y to have a length to contact the first word line WL1 and the second word line WL2 arranged in the first opening 130H1, and the first word line WL1 and the second word line WL2 arranged in the second opening 130H2. For example, the trimming insulating block TILA may have a length in the second horizontal direction Y that is less than a length in the second horizontal direction Y of the trimming insulating block TIL described with reference to FIGS. 1 through 8.

The first and second word lines WL1 and WL2 may include a main extension portion WL_me extending in the first horizontal direction X and a bending portion WL_be extending in the second horizontal direction Y from an end of the main extension portion WL_me. For example, as illustrated in FIG. 10, the trimming insulating block TILA may be arranged not to vertically overlap a corner portion of the first opening 130H1, and the bending portion WL_be may be arranged at the corner portion of the first opening 130H1 and may be inclined at an angle of about 90 degrees with respect to the main extension portion WL_me.

In embodiments, the bending portion WL_be of the first word line WL1 arranged in the first opening 130H1 may contact the trimming insulating block TILA arranged in the second interface area IA_R, and the main extension portion WL_me of the second word line WL2 arranged in the first opening 130H1 may contact the trimming insulating block TILA arranged in the second interface area IA_R. In addition, the main extension portion WL_me of the first word line WL1 arranged in the second opening 130H2 may contact the trimming insulating block TILA arranged in the second interface area IA_R, and the bending portion WL_be of the second word line WL2 arranged in the second opening 130H2 may contact the trimming insulating block TILA. In other words, one trimming insulating block TILA may contact both the first and second word lines WL1 and WL2 arranged in the first opening 130H1 and the first and second word lines WL1 and WL2 arranged in the second opening 130H2.

In addition, the word line contact WLC may be arranged on the bending portion WL_be of the first and second word lines WL1 and WL2. Accordingly, a contact area between the word line contact WLC and the first and second word lines WL1 and WL2 may increase and a contact resistance therebetween may reduce.

Figure 11:
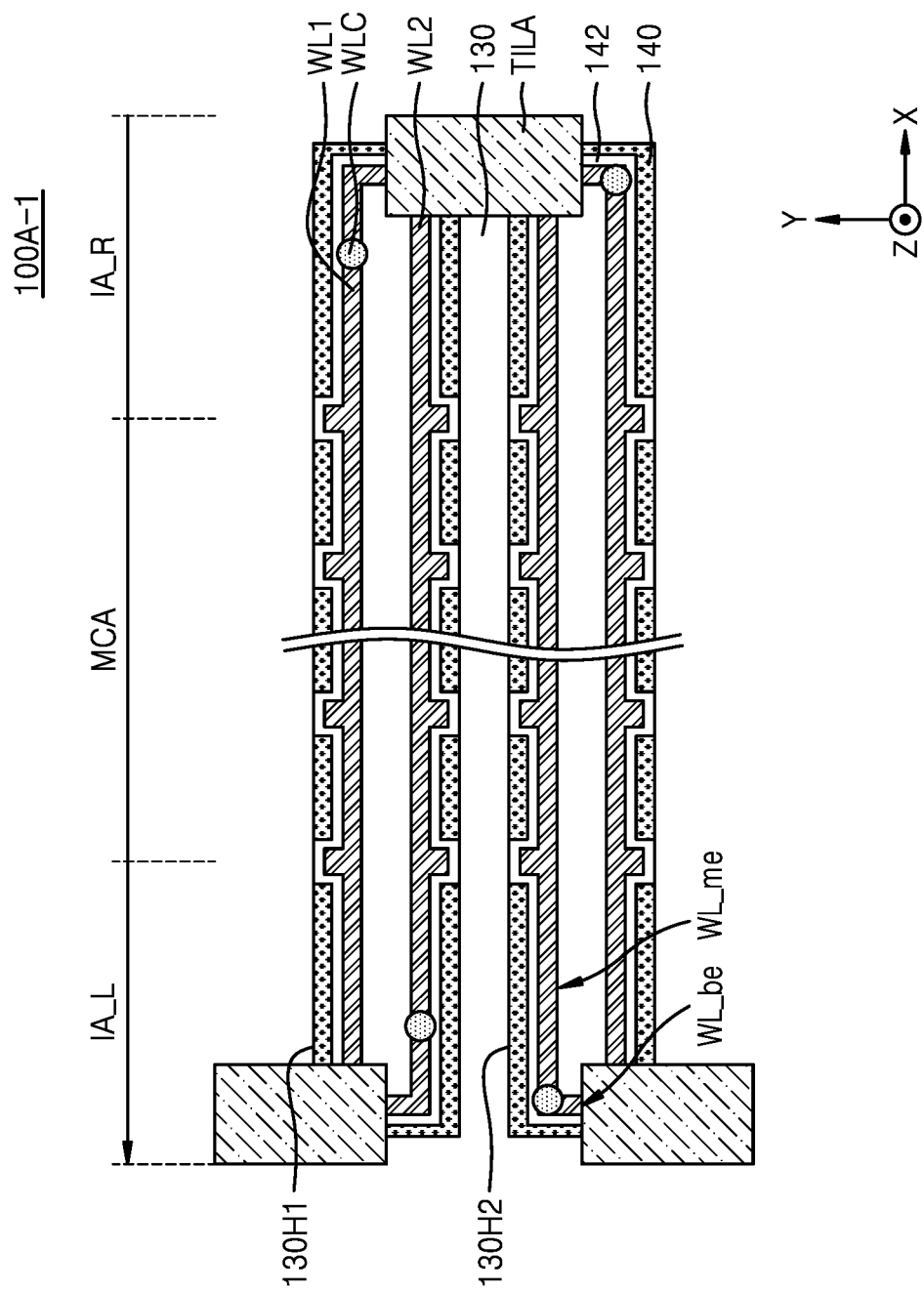

FIG. 11 is a schematic diagram illustrating an arrangement of the word line contact WLC of a semiconductor device 100A-1, according to an example embodiment.

Referring to FIG. 11, the word line contact WLC arranged on the first word line WL1 and the second word line WL2 arranged in the first opening 130H1 may be arranged on the main extension portion WL_me, and the word line contact WLC arranged on the first word line WL1 and the second word line WL2 arranged in the second opening 130H2 may be arranged on the bending portion WL_be.

Figure 12:
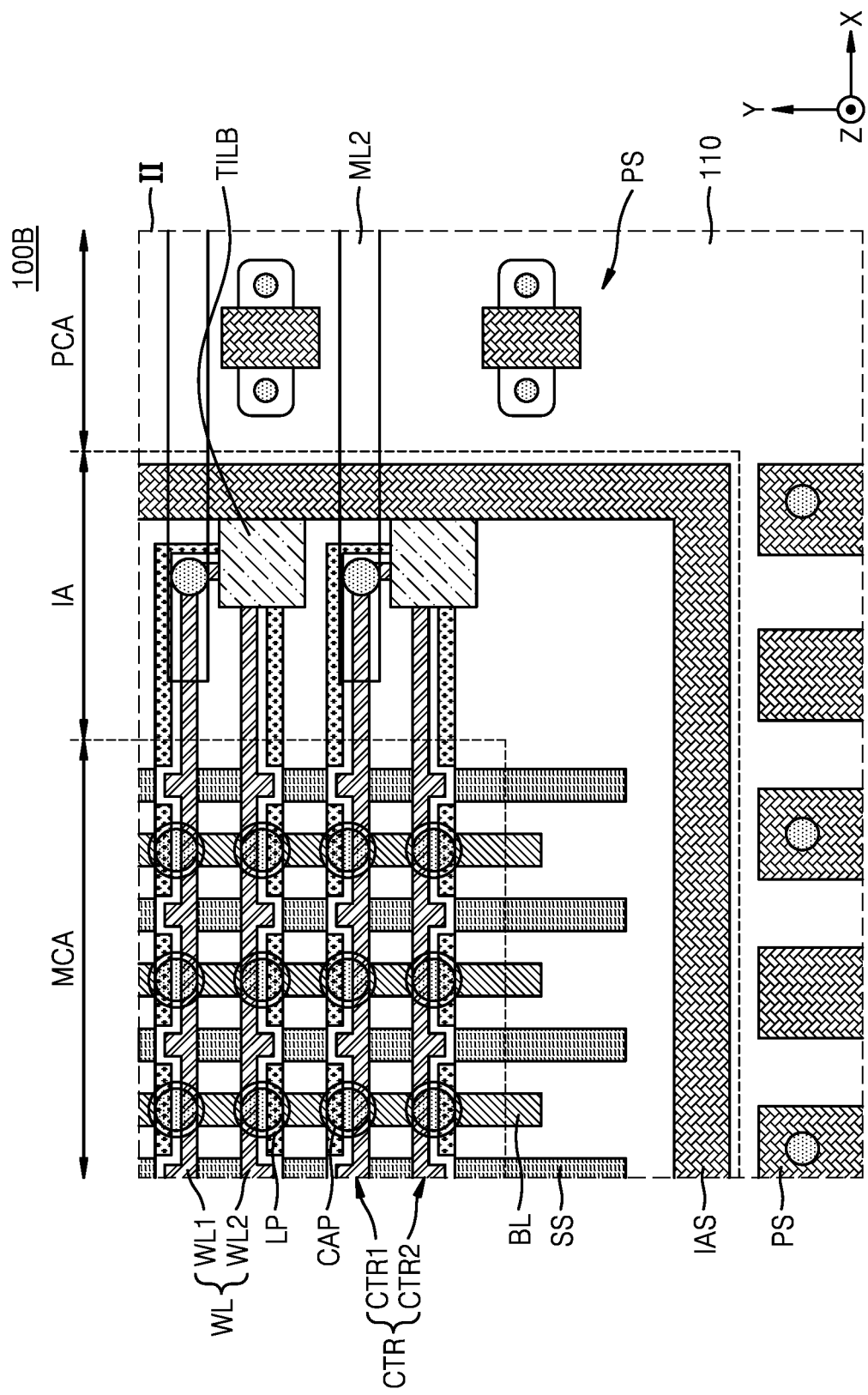
FIG. 12 is a layout diagram of a semiconductor device, according to an example embodiment.
Figure 13:
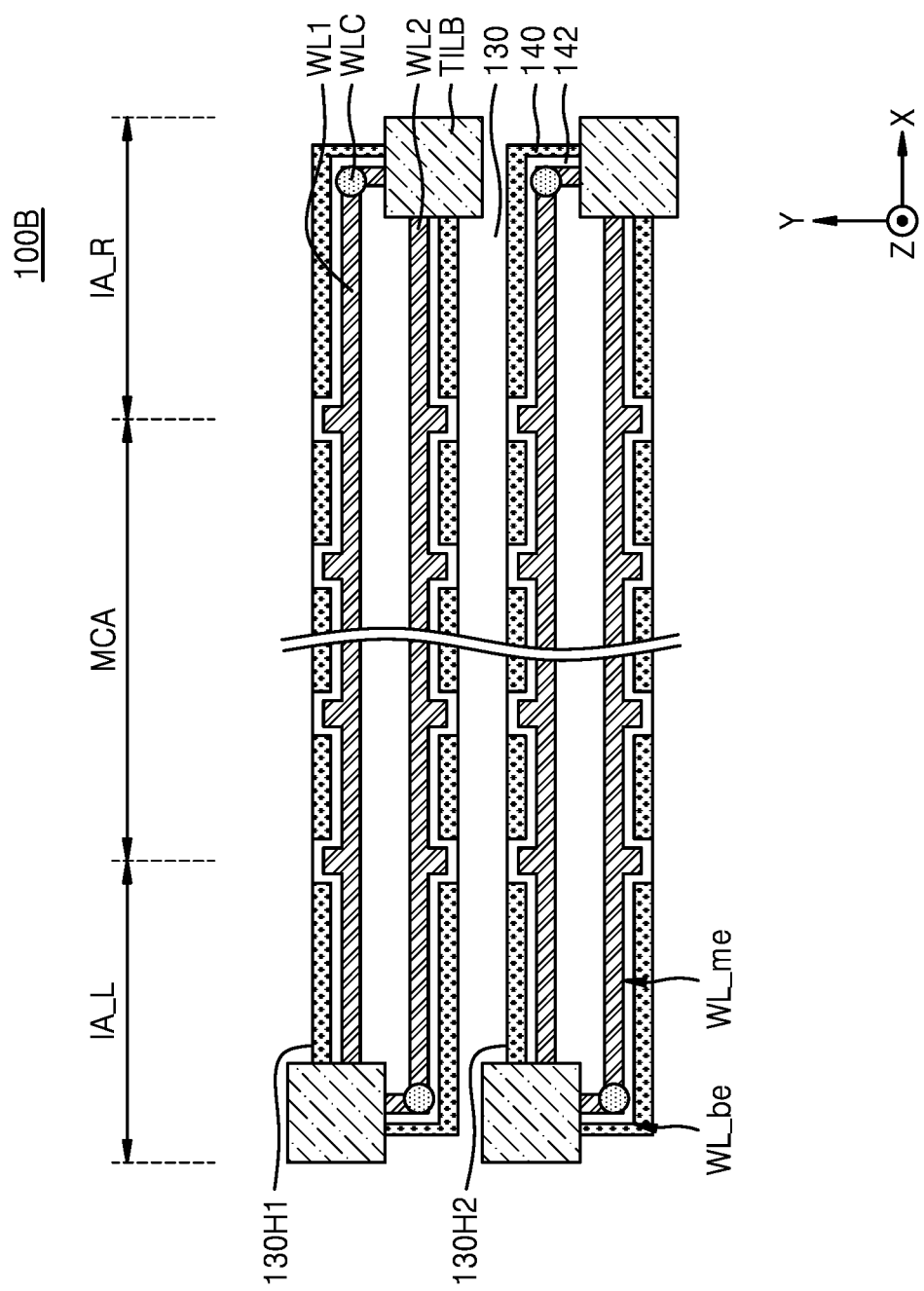
FIGS. 13 through 15 are schematic diagrams illustrating word line contact arrangements of a semiconductor device, according to example embodiments.

FIG. 12 is a layout diagram of a semiconductor device 100B according to an example embodiment. FIG. 13 is a schematic diagram illustrating an arrangement of the word line contact WLC, according to an example embodiment.

Referring to FIGS. 12 and 13, one trimming insulating block TILB may be arranged to contact the first word line WL1 and the second word line WL2 arranged in the first opening 130H1, and the other trimming insulating block TILB may be arranged to contact the first word line WL1 and the second word line WL2 arranged in the second opening 130H2. In embodiments, the width of one trimming insulating block TILB in the second horizontal direction Y may be less than or equal to the width of the first opening 130H1 in the second horizontal direction Y.

Figure 14:
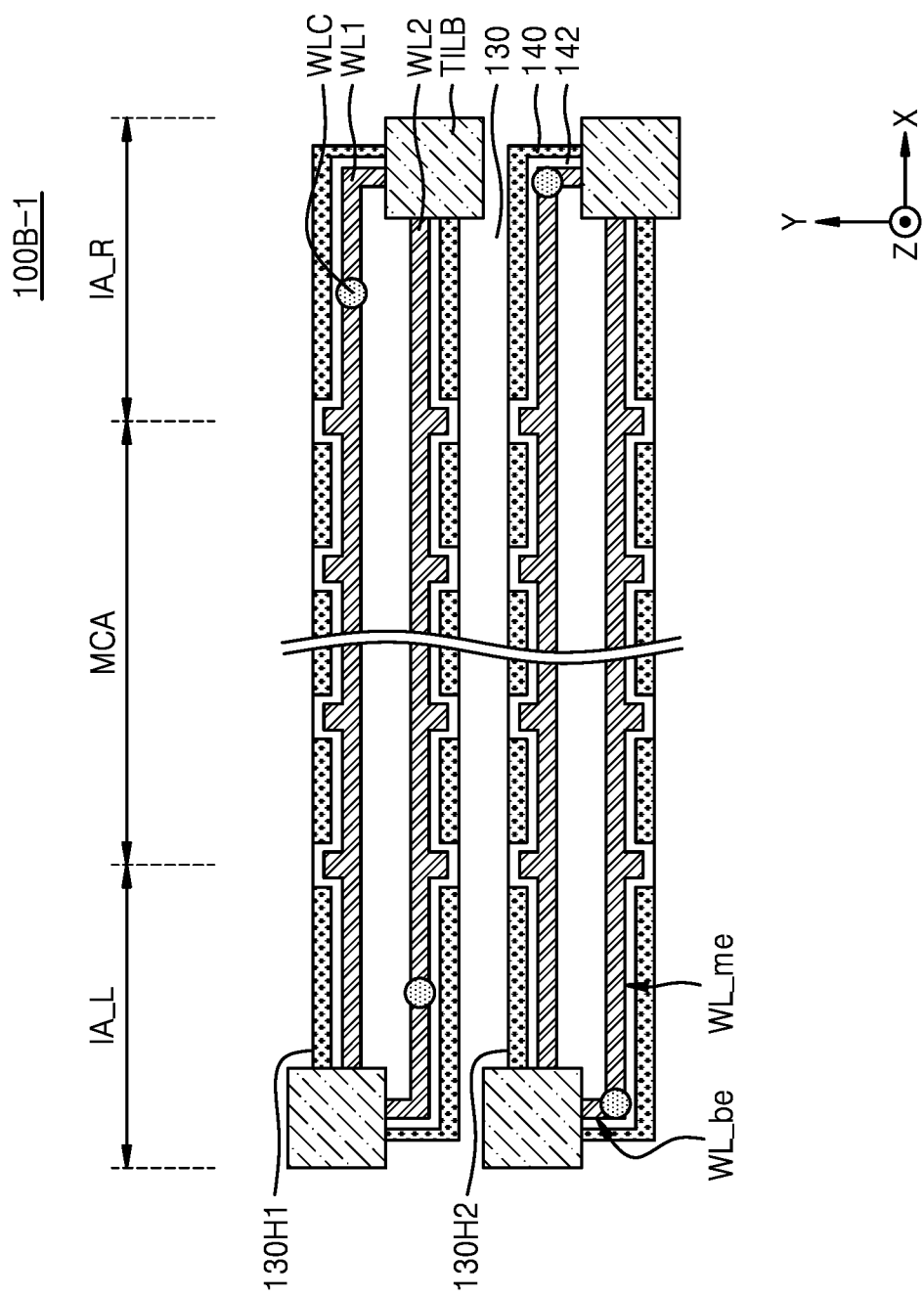

FIG. 14 is a schematic diagram illustrating an arrangement of the word line contact WLC of a semiconductor device 100B-1, according to an example embodiment.

Referring to FIG. 14, the word line contact WLC arranged on the first word line WL1 and the second word line WL2 arranged in the first opening 130H1 may be arranged on the main extension portion WL_me, and the word line contact WLC arranged on the first word line WL1 and the second word line WL2 arranged in the second opening 130H2 may be arranged on the bending portion WL_be.

Figure 15:
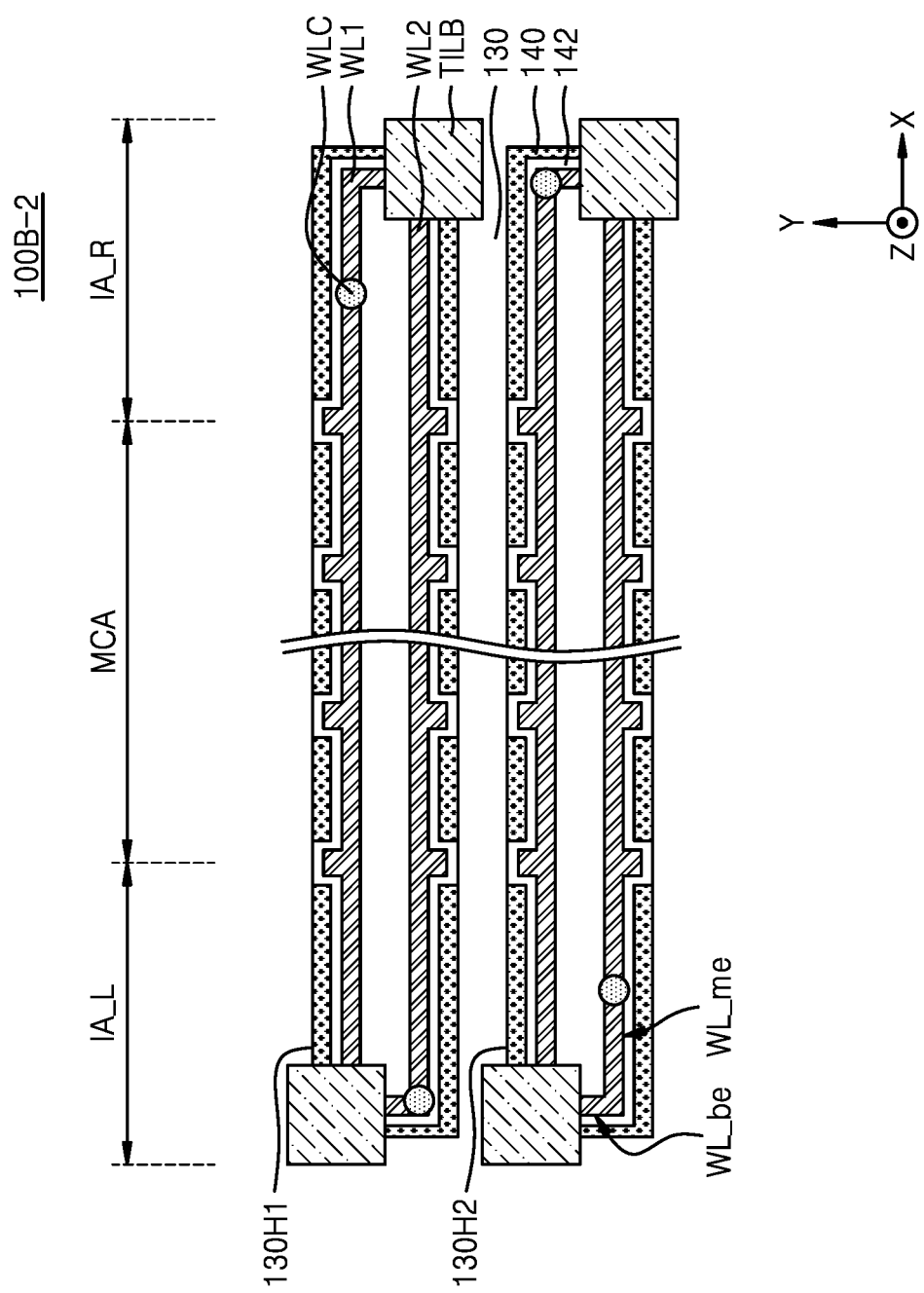

FIG. 15 is a schematic diagram illustrating an arrangement of the word line contact WLC of a semiconductor device 100B-2, according to an example embodiment.

Referring to FIG. 15, the word line contact WLC arranged on the first word line arranged in the first opening 130H1 may be arranged on the main extension portion WL_me, and the word line contact WLC arranged on the second word line WL2 arranged on the first opening 130H1 may be arranged on the bending portion WL_be. In addition, the word line contact WLC arranged on the first word line WL1 arranged in the second opening 130H2 may be arranged on the bending portion WL_be, and the word line contact WLC arranged on the second word line WL2 arranged in the second opening 130H2 may be arranged on the main extension portion WL_me.

Figure 16:
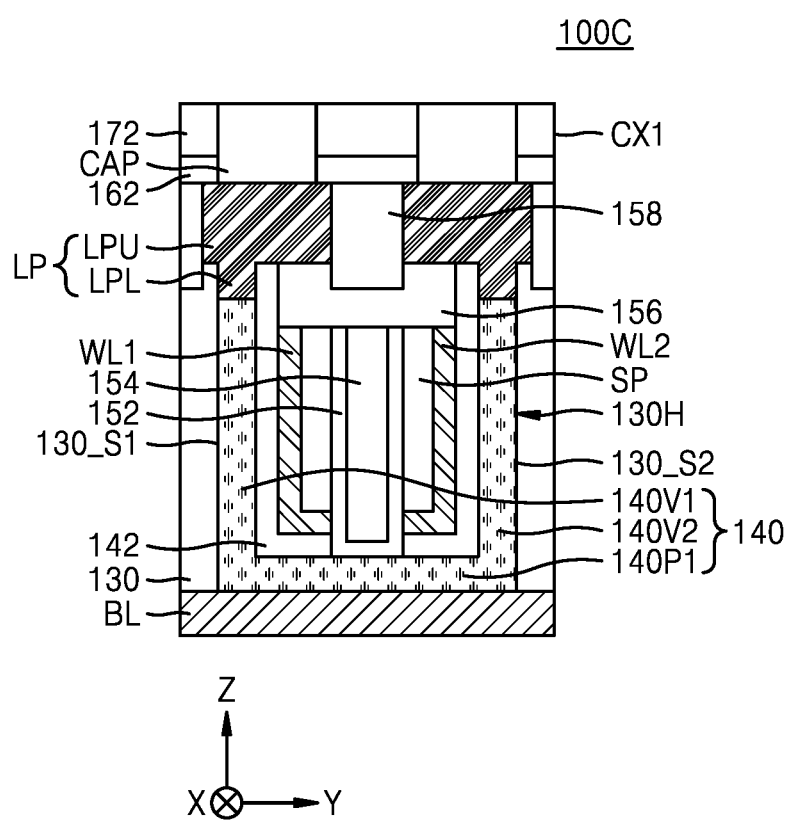
FIG. 16 is a cross-sectional view of a semiconductor device, according to an example embodiment.

FIG. 16 is a cross-sectional view of a semiconductor device 100C according to example embodiments.

Referring to FIG. 16, the first word line WL1 may have an L-shaped vertical cross-section, and the second word line WL2 may have a mirror symmetry shape with respect to the first word line WL1. The first word line WL1 may include a vertical extension portion arranged on the first sidewall 130_S1 of the opening 130H of the mold insulating layer 130, and a horizontal extension portion extending in the horizontal direction from the lower end of the vertical extension portion. In addition, the second word line WL2 may include a vertical extension portion arranged on the second sidewall 130_S2 of the opening 130H of the mold insulating layer 130, and a horizontal extension portion extending in the horizontal direction from the lower end of the vertical extension portion.

A spacer SP may be arranged between the first word line WL1 and the insulating liner 152 and between the second word line WL2 and the insulating liner 152, and the spacer SP may be arranged on the horizontal extension portion of each of the first word line WL1 and the second word line WL2. The spacer SP may contact the first and second word lines WL1 and WL2 and the insulating liner 152. An upper surface of the spacer SP may be coplanar with upper surfaces of the first and second word lines WL1 and WL2.

Figure 17:
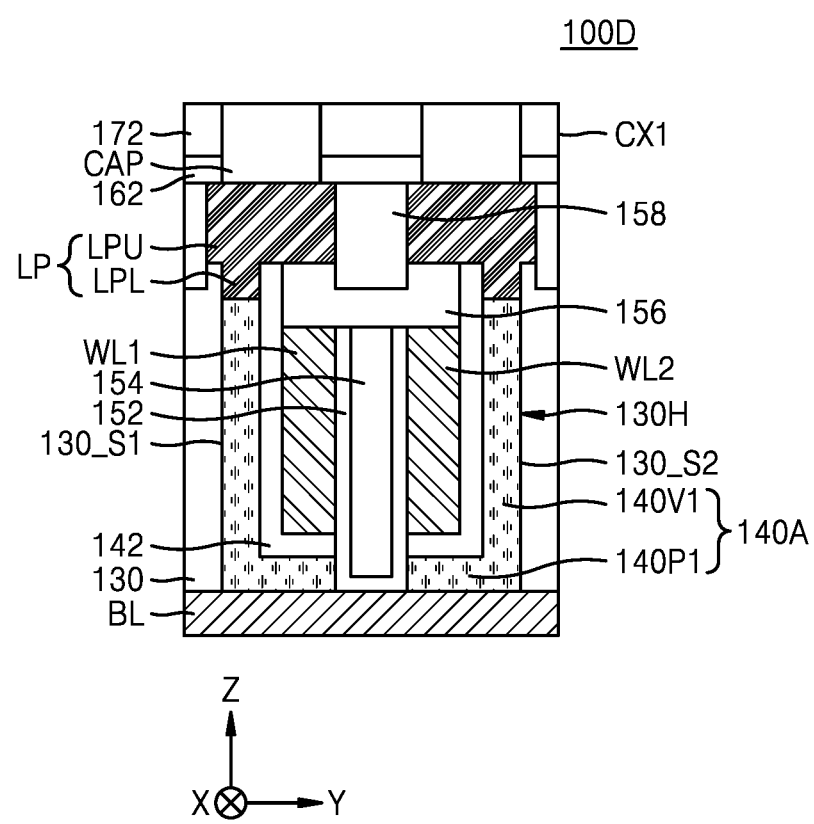
FIG. 17 is a cross-sectional view of a semiconductor device, according to an example embodiment.

FIG. 17 is a cross-sectional view of a semiconductor device 100D according to example embodiments.

Referring to FIG. 17, an active semiconductor layer 140A may have an L-shaped vertical cross-section. For example, the active semiconductor layer 140A may include a first vertical extension portion 140V1 arranged on the first sidewall 130_S1 of the opening 130H of the mold insulating layer 130, and a horizontal extension portion 140P1 extending in a horizontal direction from the lower end of the first vertical extension portion 140V1. In addition, the active semiconductor layer 140A may include a first vertical extension portion 140V1 arranged on the second sidewall 130_S2 of the opening 130H of the mold insulating layer 130, and a horizontal extension portion 140P1 extending in a horizontal direction from the lower end of the first vertical extension portion 140V1. The insulating liner 152 and the buried insulating layer 154 may be arranged between the active semiconductor layer 140A arranged on the first sidewall 130_S1 of the opening 130H and the active semiconductor layer 140A arranged on the second sidewall 130_S2 of the opening 130H, and the insulating liner 152 may contact the upper surface of the bit line BL.

Figure 18:
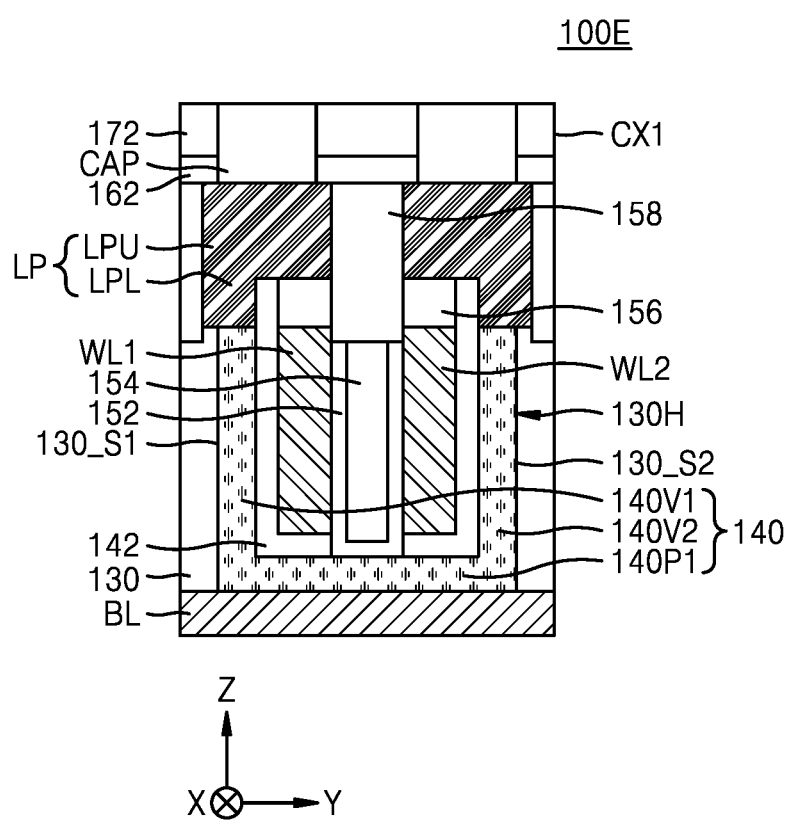
FIG. 18 is a cross-sectional view of a semiconductor device, according to an example embodiment.

FIG. 18 is a cross-sectional view of a semiconductor device 100E according to example embodiments.

Referring to FIG. 18, the landing pad LP may have an inverted L-shaped vertical cross-section. The landing pad LP may include the upper portion LPU and the lower portion LPL, and the bottom surface of the lower portion LPL may contact the upper surface of the active semiconductor layer 140 and the upper surface of the mold insulating layer 130. In addition, the width of the lower portion LPL in the second horizontal direction Y may be greater than the width of the active semiconductor layer 140 in the second horizontal direction Y.

According to example embodiments, before the landing pad LP is formed, an upper portion of the mold insulating layer 130 may be removed by a recess process such that the upper surface of the mold insulating layer 130 is at a lower level than the upper surface of the gate insulating layer 142. Accordingly, the upper surfaces of the mold insulating layer 130 and the active semiconductor layer 140 may be arranged on the same plane. In addition, the bottom surface of the landing pad LP may be at a higher vertical level than the upper surface of the word line WL, and thus, horizontal overlapping between the landing pad LP and the word line WL may be prevented.

FIGS. 19A through 24B are cross-sectional views illustrating a method of manufacturing the semiconductor device 100, according to example embodiments. FIGS. 19A, 20A, 21A, 22A, 23A, and 24A are cross-sectional views taken along line A-A', line B-B', and line C-C' in FIG. 2, and FIGS. 19B, 20B, 21B, 22B, 23B, and 24B are cross-sectional views taken along line D-D' and E-E' in FIG. 2.

Figure 19A:
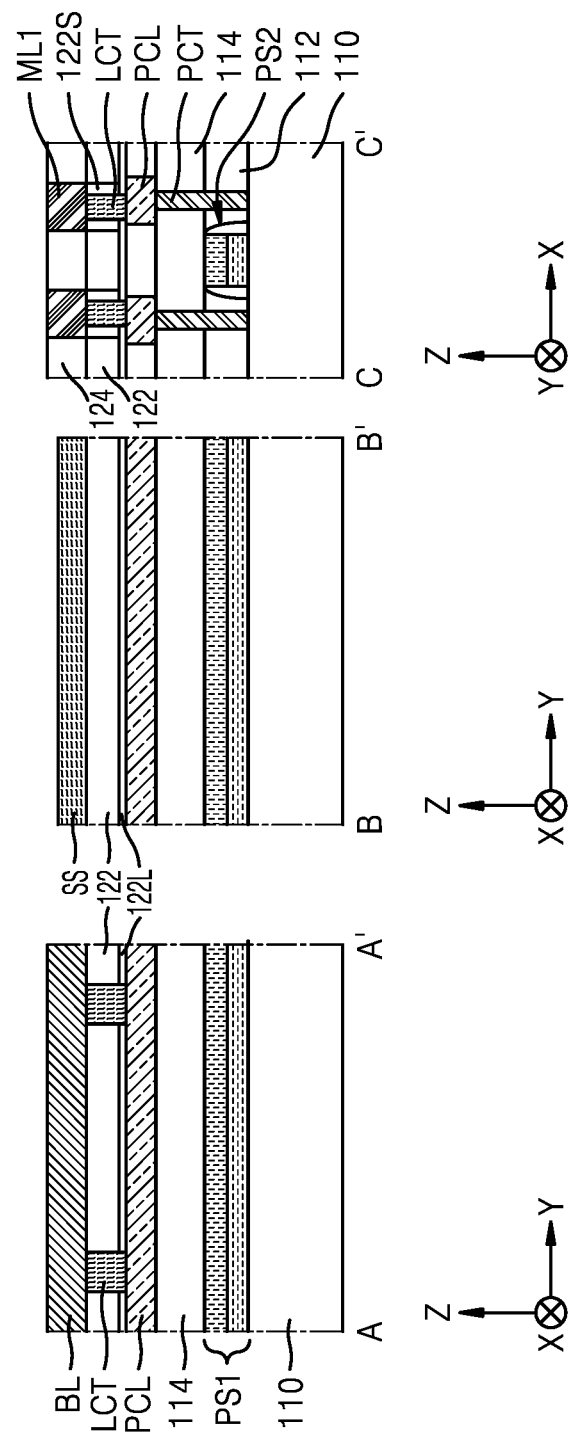
FIGS. 19A through 24B are cross-sectional views illustrating a manufacturing method of a semiconductor device, according to example embodiments.
Figure 19B:
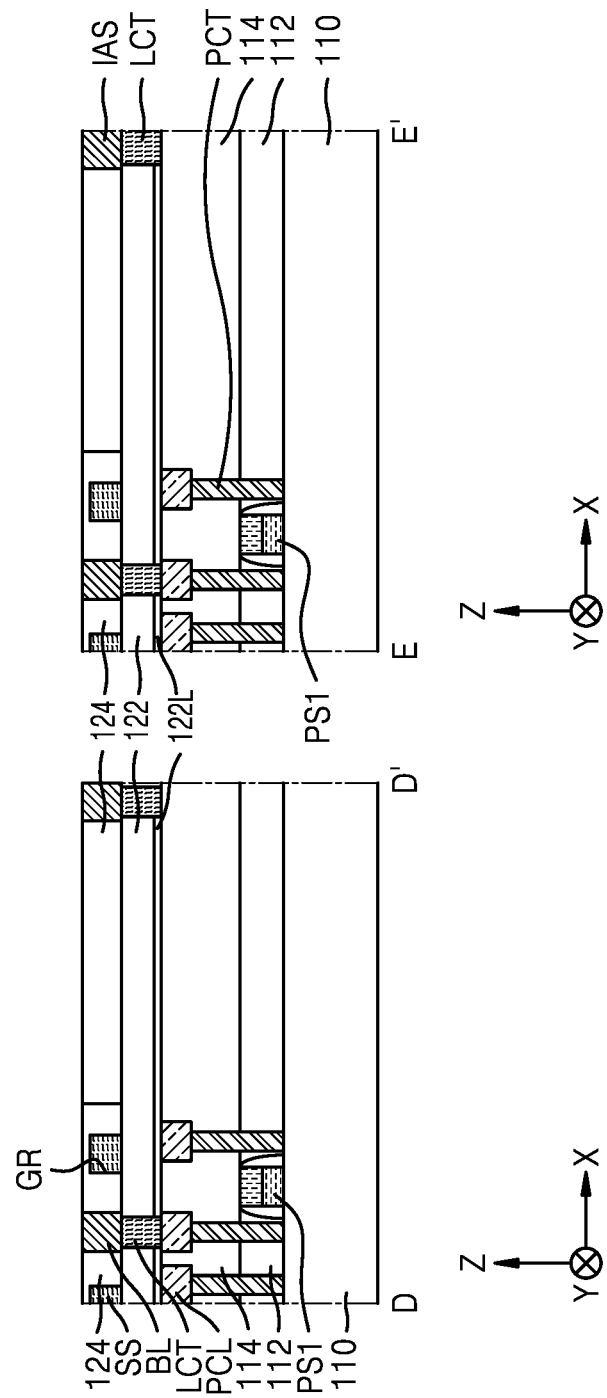

Referring to FIGS. 19A and 19B, the periphery circuit structure PS may be formed on the substrate 110. For example, the core circuits PS1 may be formed in the cell array area MCA, and the periphery circuits PS2 may be formed in the periphery circuit area PCA. In addition, the periphery circuit line PCL and the periphery circuit contact PCT electrically connected to the periphery circuit structure PS, and the lower insulating layer 112 and the periphery circuit insulating layer 114 covering the periphery circuit structure PS may be formed.

Thereafter, the plurality of bit lines BL may be formed on the periphery circuit insulating layer 114. For example, the etch stop layer 122L and the first insulating layer 122 may be formed on the periphery circuit insulating layer 114, and the line contact plug LCT may be formed to penetrate the first insulating layer 122 and the etch stop layer 122L and to be electrically connected to the periphery circuit line PCL. Thereafter, a conductive layer (not illustrated) may be formed on the line contact plug LCT and the first insulating layer 122, and the plurality of bit lines BL may be formed by patterning the conductive layer.

In addition, in the process for forming the bit line BL, the interface wiring structure IAS may be formed in the interface area IA, and the lower wiring line ML1 may be further formed in the periphery circuit area PCA.

Thereafter, the second insulating layer 124 covering the bit line BL may be formed. The second insulating layer 124 may be formed to cover the upper surface and side surfaces of the bit line BL and define a gap region GR. Thereafter, the shielding structure SS may be formed by filling the gap region GR with a metal material. Thereafter, a capping insulating layer (not illustrated) may be further formed on the upper surface of the shielding structure SS.

Figure 20A:
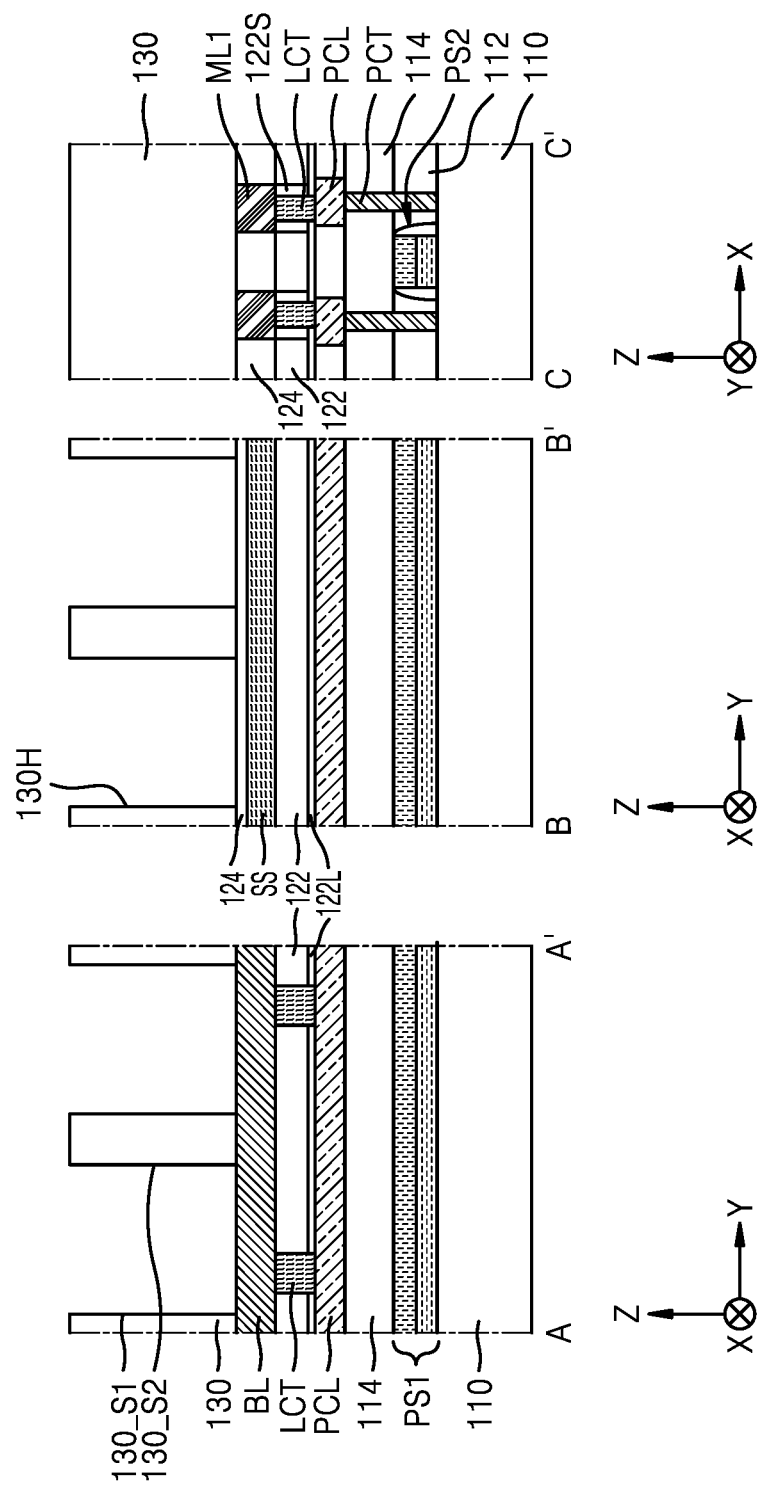
Figure 20B:
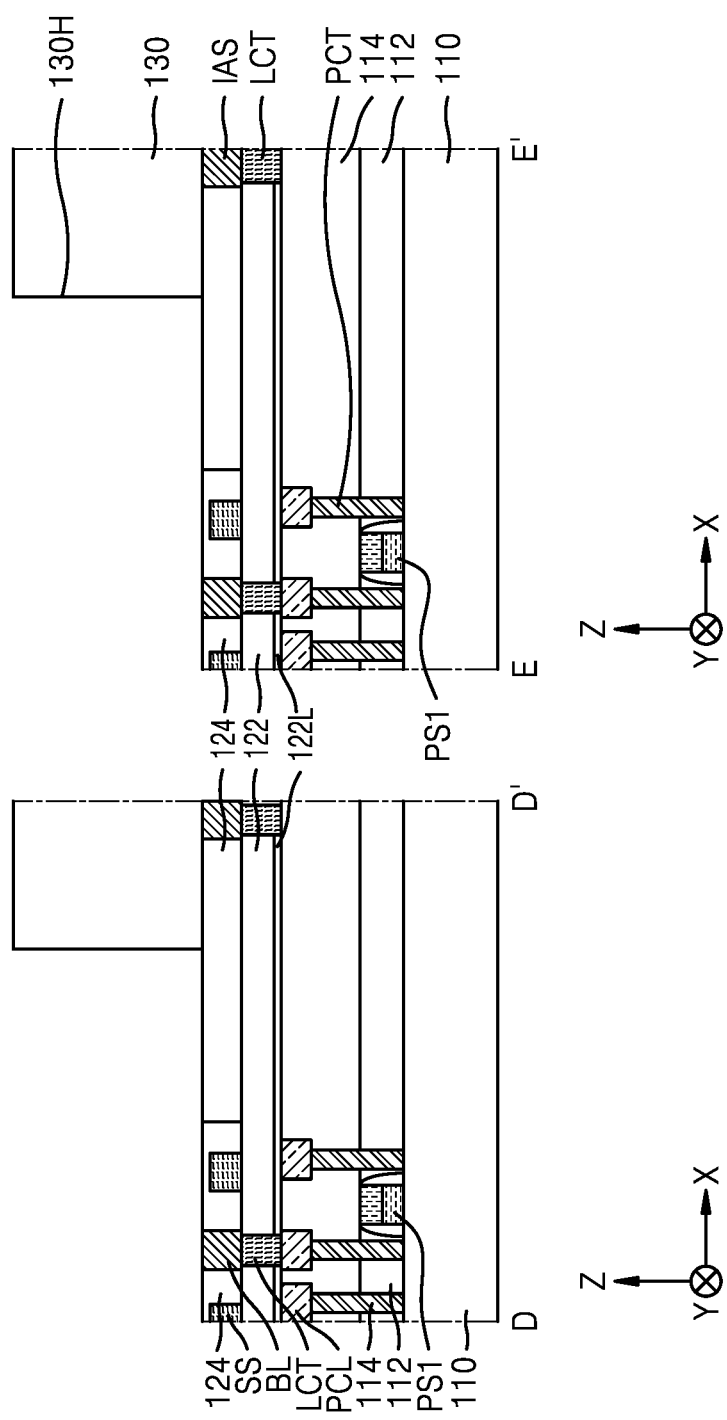

Referring to FIGS. 20A and 20B, a mold insulating layer 130 may be formed on the bit line BL and the second insulating layer 124. The mold insulating layer 130 may include a plurality of openings 130H extending in the first horizontal direction X, and upper surfaces of the plurality of bit lines BL may be exposed at bottom portions of the plurality of openings 130H. The plurality of openings 130H may include the first sidewall 130_S1 and the second sidewall 130_S2 opposite to each other and extending in the first horizontal direction X.

In embodiments, the mold insulating layer 130 may be formed to have a relatively large height in the vertical direction Z by using at least one of silicon oxide, silicon nitride, silicon oxynitride, and a low dielectric constant material.

Figure 21A:
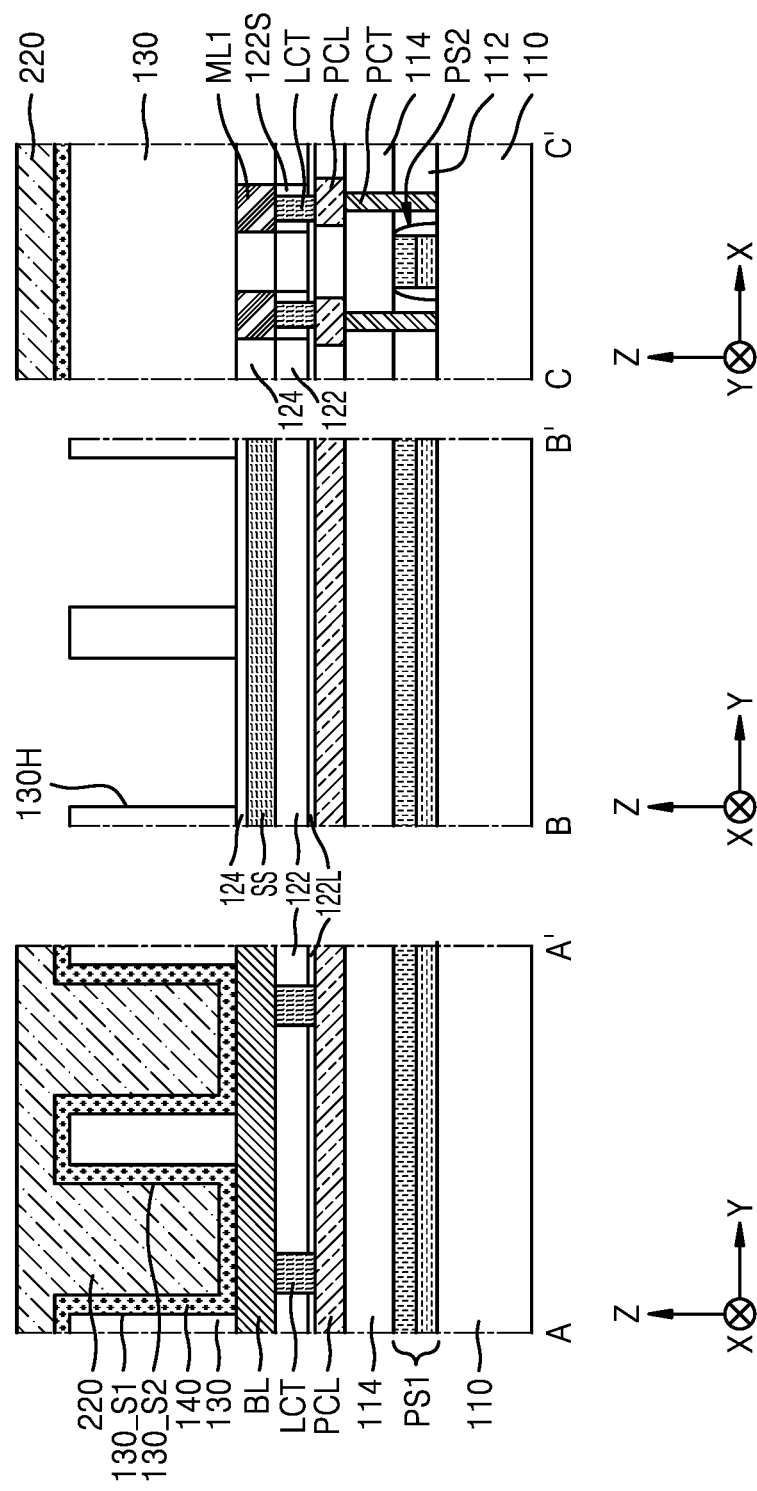
Figure 21B:
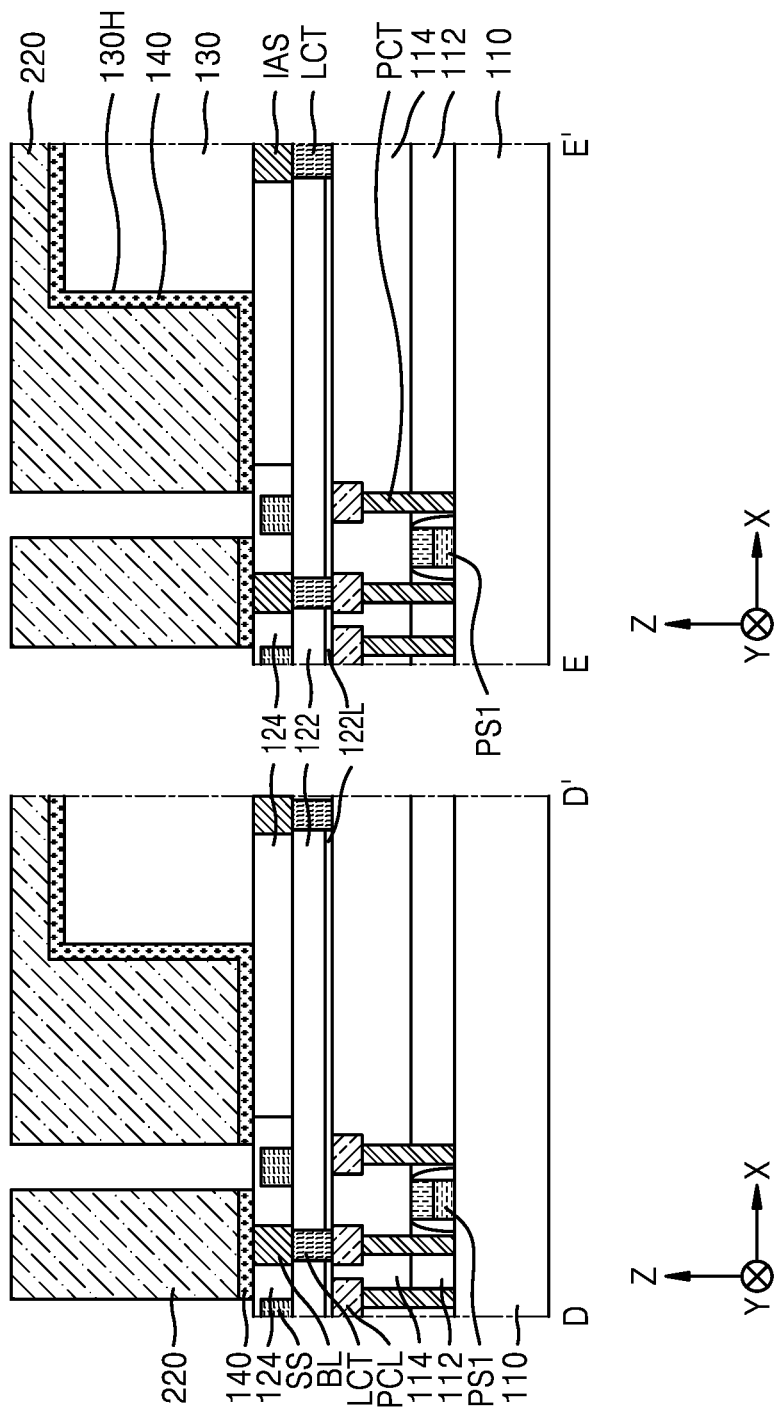

Referring to FIGS. 21A and 21B, the active semiconductor layer 140 may be formed to conformally cover the inner wall of the opening 130H in the mold insulating layer 130.

In embodiments, the active semiconductor layer 140 may be formed by using an oxide semiconductor material. In embodiments, the active semiconductor layer 140 may be formed by using at least one of a chemical vapor deposition (CVD) process, a low-pressure CVD process, a plasma-enhanced CVD process, an organometallic CVD (MOCVD) process, and an atomic layer lamination process.

Thereafter, a first mask layer 220 may be formed on the active semiconductor layer 140. The first mask layer 220 may be formed to be sufficiently thick to completely fill the opening 130H.

Thereafter, a mask pattern (not illustrated) may be formed on the first mask layer 220, and a portion of the active semiconductor layer 140 may be removed by using the mask pattern and the first mask layer 220 as etching masks. For example, the mask pattern may have a line shape extending in the second horizontal direction Y, and accordingly, the active semiconductor layer 140 may also remain to extend in the second horizontal direction Y on the inner wall of the opening 130H and the upper surface of the mold insulating layer 130.

Thereafter, the first mask layer 220 may be removed.

Figure 22A:
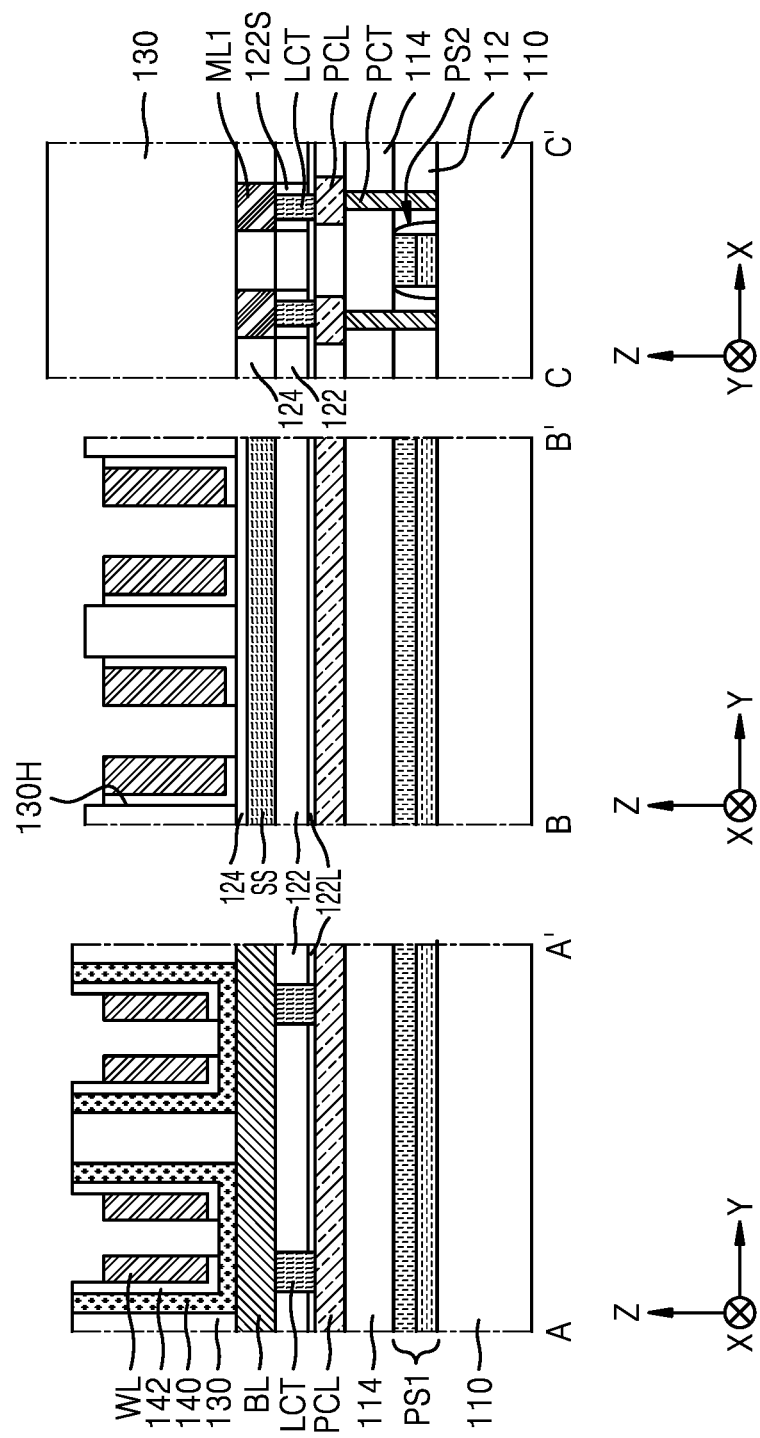
Figure 22B:
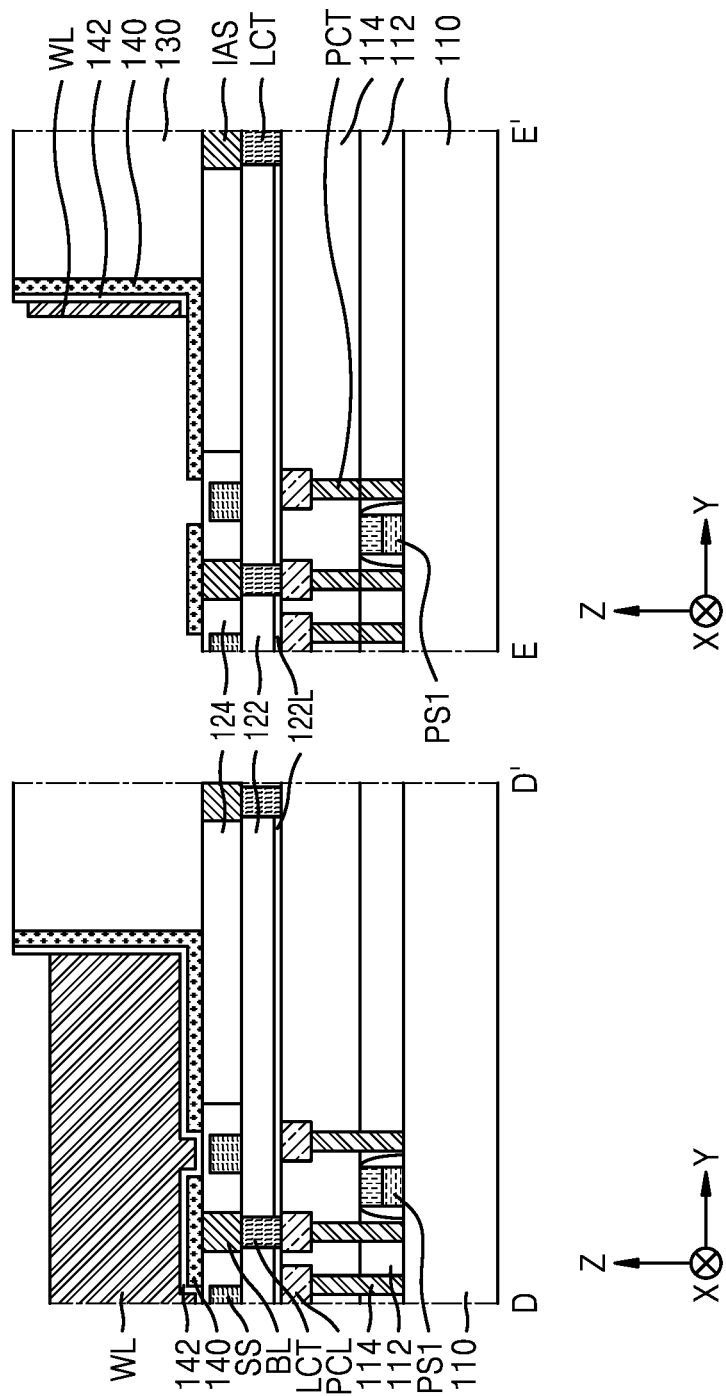

Referring to FIGS. 22A and 22B, the gate insulating layer 142 may be formed on the active semiconductor layer 140.

The gate insulating layer 142 may include at least one selected from a high-k dielectric material and a ferroelectric material having a dielectric constant higher than that of silicon oxide. In some embodiments, the gate insulating layer 142 may include at least one of hafnium oxide (HfO), hafnium silicate (HfSiO), hafnium oxynitride (HfON), hafnium silicon oxynitride (HfSiON), or lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PbZrTiO), strontium tantalum bismuth oxide (SrTiBiO), bismuth ferrous oxide (BiFeO), strontium titanium oxide (SrTiO), yttrium oxide (YO), aluminum oxide (AlO), and lead scandium tantalum oxide (PbScTaO).

Thereafter, a conductive layer (not illustrated) may be formed on the gate insulating layer 142, and an anisotropic etching process may be performed on the conductive layer to remove the conductive layer portion arranged on the bottom portion of the opening 130H and leave the word line WL on the sidewall of the opening 130H.

In embodiments, the word line WL may be formed by using Ti, TiN, Ta, TaN, Mo, Ru, W, WN, TiSiN, WSiN, polysilicon, or a combination thereof.

Figure 23A:
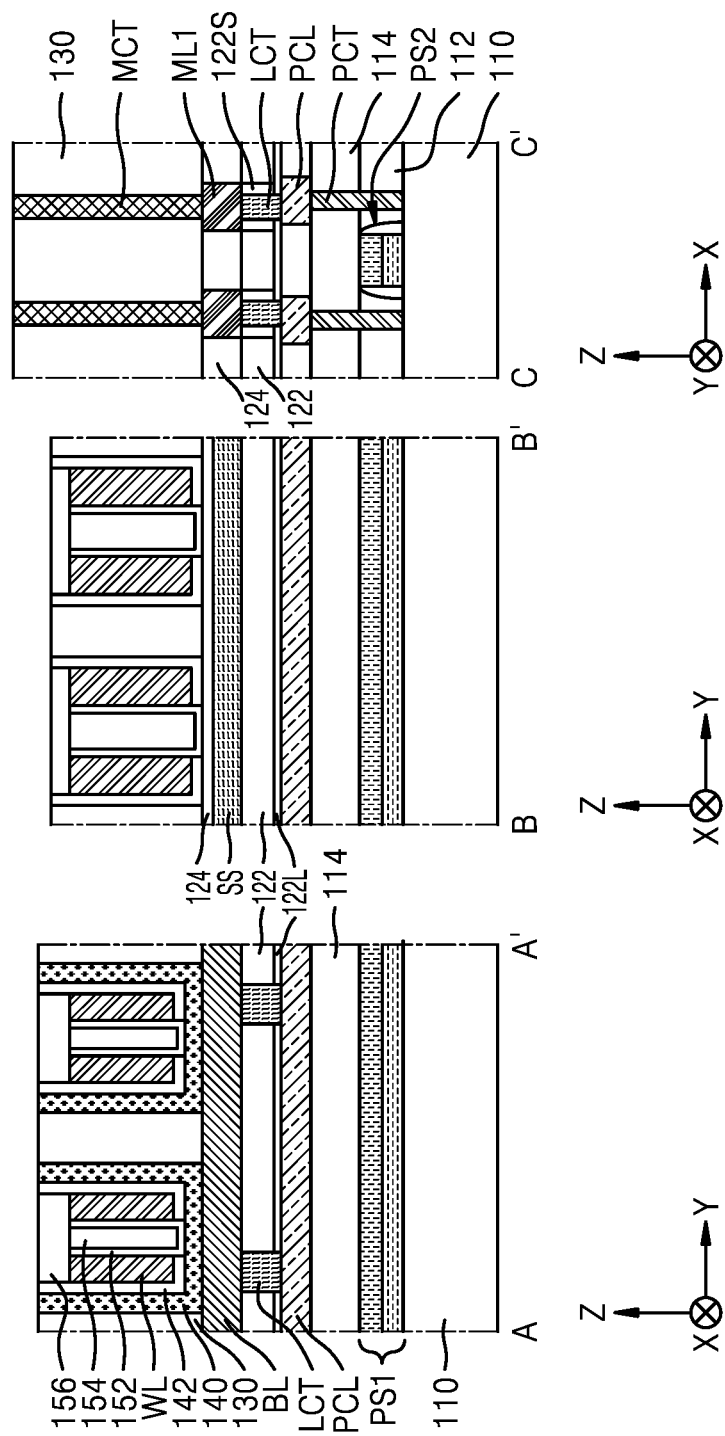
Figure 23B:
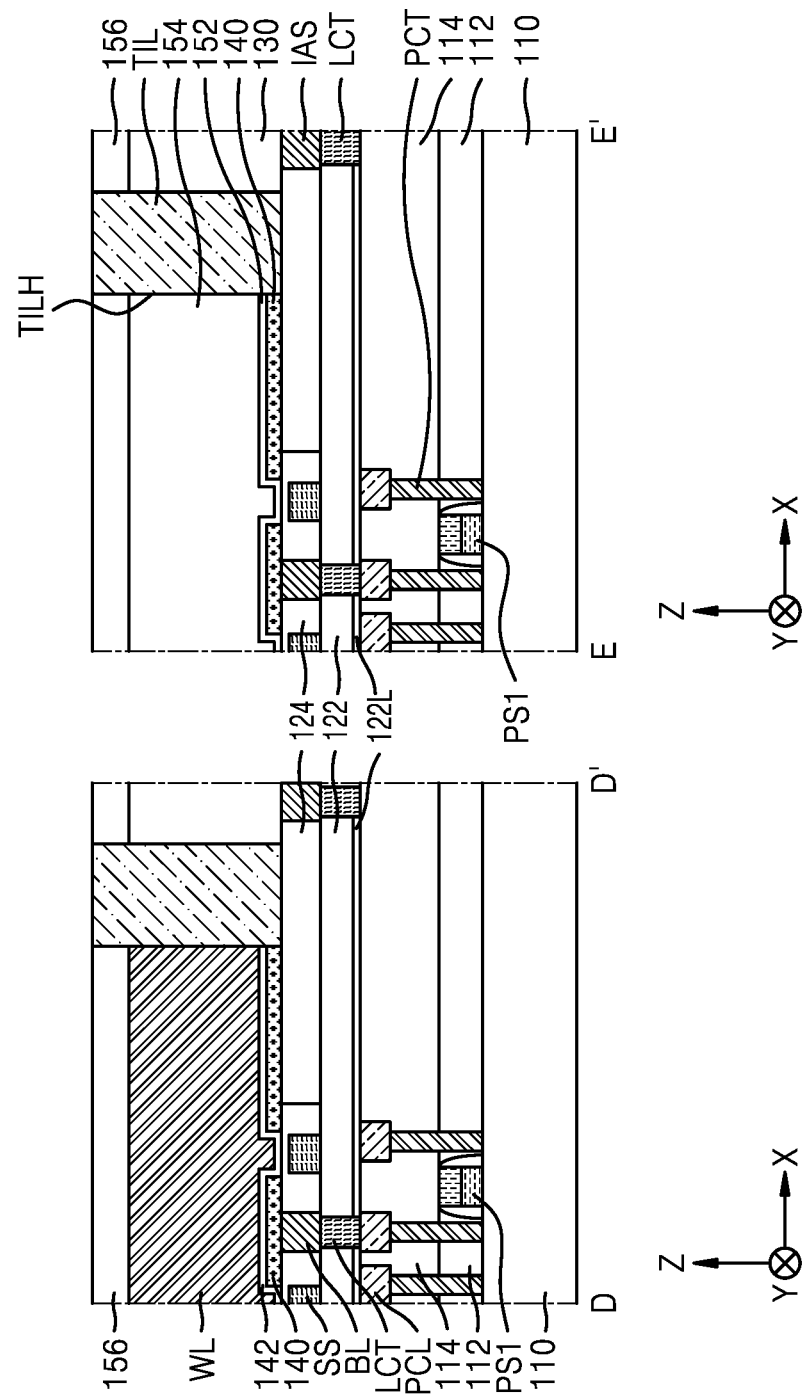

Referring to FIGS. 23A and 23B, the insulating liner 152 and the buried insulating layer 154 may be formed inside the opening 130H. The insulating liner 152 may be conformally arranged on the upper surface of the word line WL, on the upper surface of the active semiconductor layer 140, and on the upper surface of the mold insulating layer 130, and the buried insulating layer 154 on the insulating liner 152 may fill the opening 130H.

In embodiments, an etch-back process may be performed on the upper surface of the buried insulating layer 154, and the upper surface of the buried insulating layer 154 may be arranged at the same level as the upper surface of the insulating liner 152 arranged on the word line WL.

Thereafter, the upper insulating layer 156 may be formed on the insulating liner 152 and the buried insulating layer 154 arranged inside the opening 130H.

Thereafter, the trimming block opening TILH may be formed by removing portions of the word line WL, the gate insulating layer 142, and the active semiconductor layer 140 arranged at one end of the opening 130H of the mold insulating layer 130 in the interface area IA. By forming the trimming block opening TILH, the first word line WL1 arranged on the first sidewall 130_S1 of the opening 130H and the second word line WL2 arranged on the second sidewall 130_S2 of the opening 130H may be separated from each other.

A trimming block insulating layer TIL may be formed inside the trimming block opening TILH. The trimming block insulating layer TIL may be formed by using at least one of silicon oxide, silicon nitride, silicon oxynitride, and a low dielectric constant material.

Figure 24A:
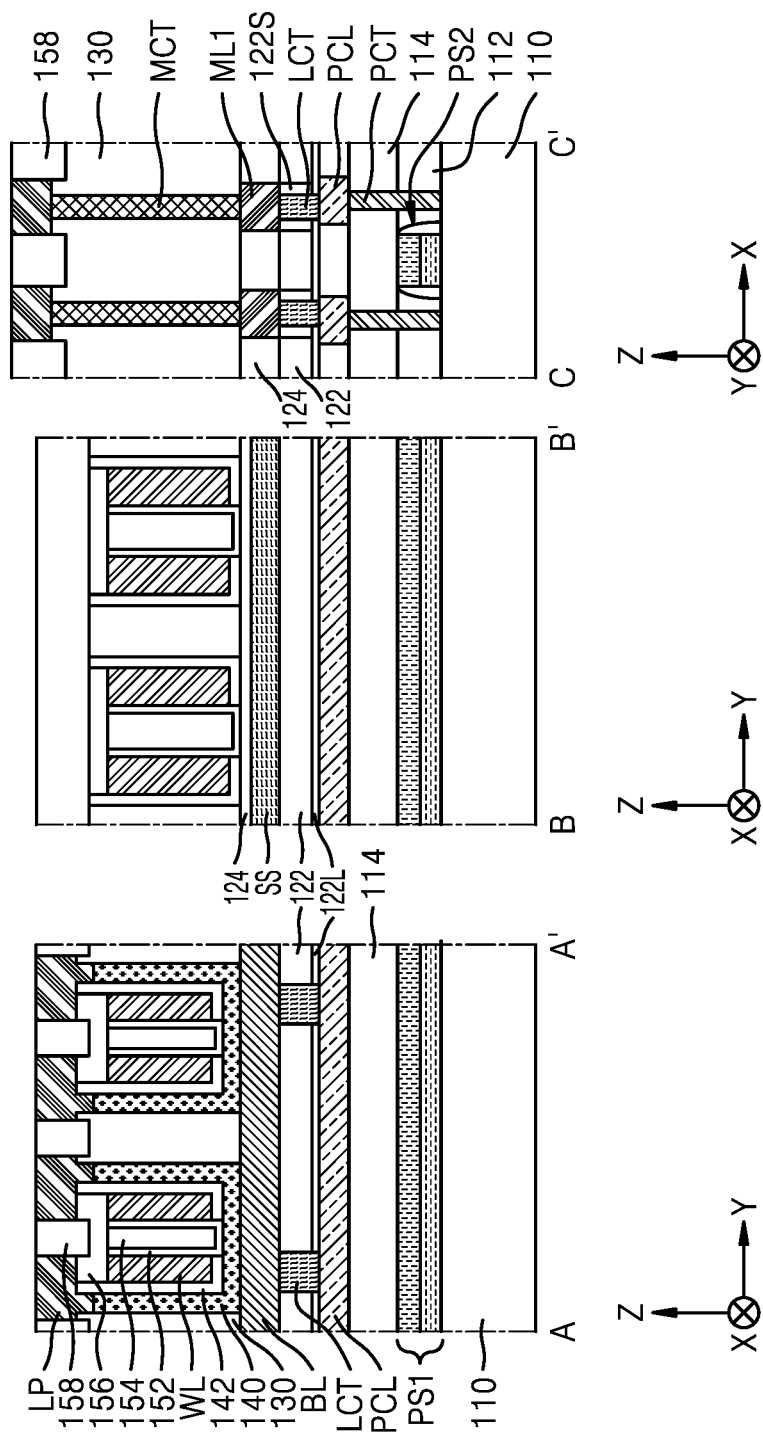
Figure 24B:
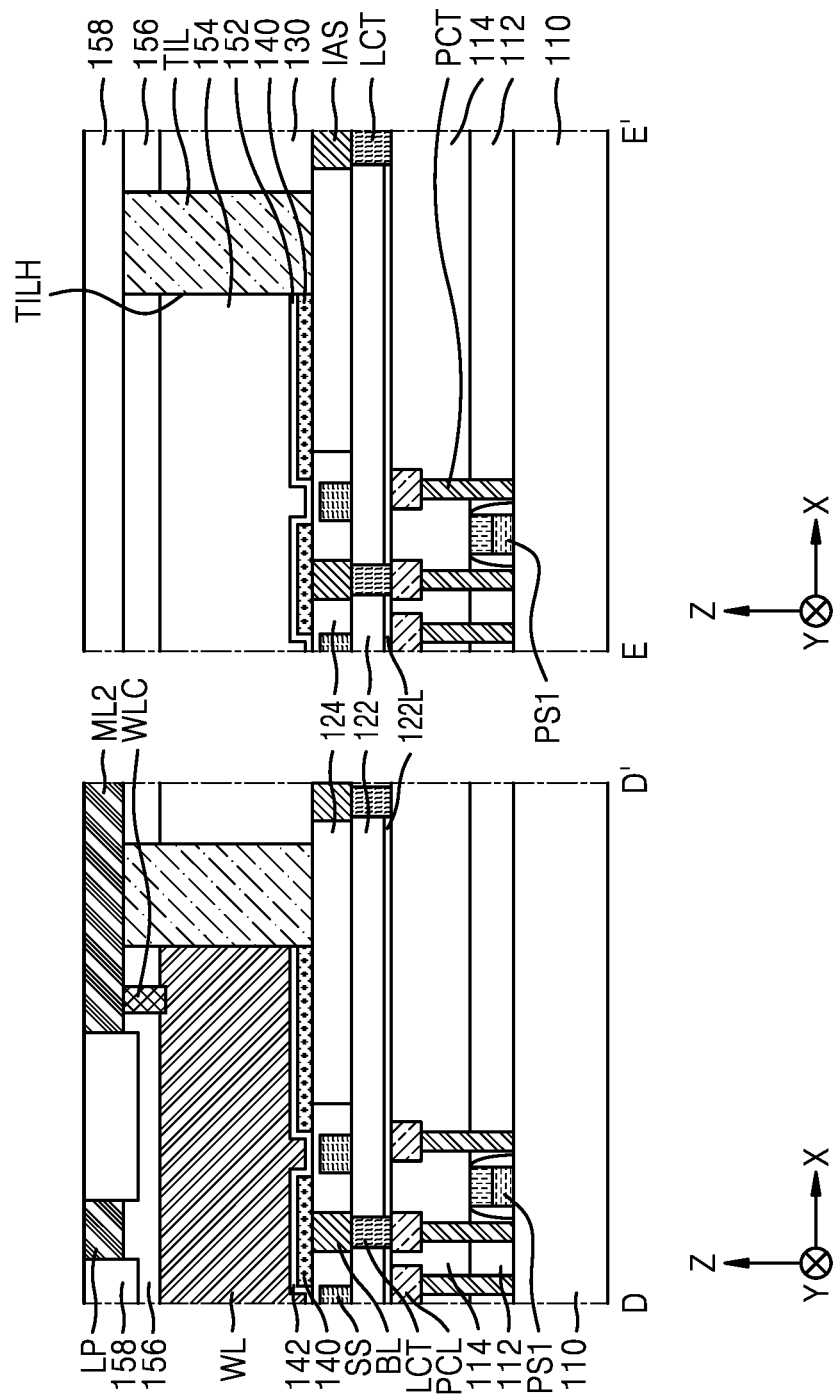

Referring to FIGS. 24A and 24B, a landing pad conductive layer (not illustrated) may be formed on the mold insulating layer 130 and the upper insulating layer 156, a mask pattern (not illustrated) may be formed on the landing pad conductive layer, and the landing pad LP may be formed by removing a portion of the landing pad conductive layer by using the mask pattern. Thereafter, the landing pad insulating layer 158 may be formed in an area from which the landing pad conductive layer has been removed.

Referring to FIGS. 3 and 4 again, the etching stop layer 162 may be formed on the landing pad LP and the landing pad insulating layer 158. The capacitor structure CAP may be formed on the etching stop layer 162.

The semiconductor device 100 may be completed by performing the processes described above.

According to example embodiments, two adjacent word lines WL may be electrically isolated from each other by forming the trimming insulating block TIL in the interface area IA, and thus, the degree of freedom of arrangement of the word line contact WLC with respect to the trimming insulating block TIL may increase. The semiconductor device 100 may have a reduced leakage current and a reduced contact resistance.

While the inventive concept has been particularly shown and described with reference to embodiments thereof, it will be understood that various changes in form and details may be made therein without departing from the spirit and scope of the following claims.

What is claimed is:

1. A semiconductor device comprising:
  a substrate including a cell array area, a periphery circuit area, and an interface area between the cell array area and the periphery circuit area;
  a plurality of bit lines arranged in the cell array area of the substrate and extending in a first horizontal direction;
  a mold insulating layer arranged on the plurality of bit lines, the mold insulating layer including a plurality of openings extending lengthwise in a second horizontal direction;
  a plurality of channel layers respectively arranged on the plurality of bit lines in each of the plurality of openings of the mold insulating layer;
  a plurality of word lines respectively arranged on the plurality of channel layers and extending lengthwise in the second horizontal direction from the cell array area to the interface area, the plurality of word lines including a first word line arranged on a first sidewall of each opening of the mold insulating layer and a second word line arranged on a second sidewall of the opening; and
  a trimming insulating block arranged in the interface area of the substrate and connected to an end of the first word line and an end of the second word line.

2. The semiconductor device of claim 1, wherein the trimming insulating block extends in the first horizontal direction, and crosses both a first opening and a second opening of the plurality of openings adjacent to each other in the first horizontal direction.

3. The semiconductor device of claim 2, wherein the trimming insulating block contacts an end of each of the plurality of word lines.

4. The semiconductor device of claim 1,
  wherein the plurality of channel layers comprises:
    a first vertical extension portion arranged on the first sidewall of the opening of the mold insulating layer;
    a second vertical extension portion arranged on the second sidewall of the opening; and
    a horizontal extension portion arranged on a bottom portion of the opening and arranged on the bit line,
  wherein the first word line is arranged on a sidewall of the first vertical extension portion, and
  wherein the second word line is arranged on a sidewall of the second vertical extension portion.

5. The semiconductor device of claim 1,
  wherein the first word line comprises:
    a main extension portion arranged in the cell array area and extending in the second horizontal direction; and
    a bending portion arranged in the interface area, connected to the main extension portion, and extending in the first horizontal direction,
  wherein the main extension portion and the bending portion of the first word line contact the trimming insulating block,
  wherein the second word line comprises a main extension portion arranged in the cell array area and extending in the second horizontal direction, and
  wherein the main extension portion of the second word line contacts the trimming insulating block.

6. The semiconductor device of claim 5, further comprising a word line contact arranged in the interface area and arranged on the bending portion of the first word line.

7. The semiconductor device of claim 1,
  wherein the plurality of openings comprise a first opening and a second opening adjacent to each other in the first horizontal direction, and
  wherein a first portion of the trimming insulating block vertically overlaps the first opening, and a second portion of the trimming insulating block vertically overlaps the second opening.

8. The semiconductor device of claim 1,
  wherein the plurality of openings comprise a first opening and a second opening adjacent to each other in the first horizontal direction, and
  wherein the trimming insulating block comprises:
    a first trimming insulating block vertically overlapping the first opening; and
    a second trimming insulating block vertically overlapping the second opening and arranged apart from the first trimming insulating block.

9. The semiconductor device of claim 1,
  wherein an upper surface of the trimming insulating block is at a level higher than an upper surface of the plurality of word lines, and
  wherein a bottom surface of the trimming insulating block is at a level equal to or lower than a bottom surface of the plurality of word lines.

10. The semiconductor device of claim 1,
wherein the plurality of channel layers comprises:
a first vertical extension portion arranged on the first sidewall of the opening of the mold insulating layer;
a second vertical extension portion arranged on the second sidewall of the opening; and
a horizontal extension portion arranged on a bottom portion of the opening and arranged on the bit line, and
wherein each of the plurality of channel layers comprises a U-shaped vertical cross-section.

11. The semiconductor device of claim 10, further comprising:
in the cell array area, a landing pad arranged on each of the first vertical extension portion and the second vertical extension portion of the plurality of channel layers;
word line contacts arranged on end portions of the plurality of word lines in the interface area; and
a routing wiring line arranged on the word line contact in the interface area, and arranged at a same vertical level as the landing pad.

12. The semiconductor device of claim 1, further comprising:
a periphery circuit arranged in the cell array area, the periphery circuit arranged between the substrate and the plurality of bit lines, and electrically connected to the plurality of bit lines; and
a shielding structure extending between the plurality of bit lines in the first horizontal direction.

13. A semiconductor device comprising:
a substrate including a cell array area, a periphery circuit area, and an interface area between the cell array area and the periphery circuit area;
a plurality of bit lines arranged in the cell array area of the substrate and extending in a first horizontal direction;
a plurality of channel layers respectively arranged on the plurality of bit lines, each of the plurality of channel layers including a first vertical extension portion and a second vertical extension portion spaced apart from each other in the first horizontal direction, and a horizontal extension portion connected to a bottom portion of the first vertical extension portion and a bottom portion of the second vertical extension portion;
a plurality of word lines respectively arranged on the plurality of channel layers and extending lengthwise from the cell array area to the interface area in a second horizontal direction, the plurality of word lines including a first word line arranged on a sidewall of the first vertical extension portion of the plurality of channel layers and a second word line arranged on a sidewall of the second vertical extension portion of the plurality of channel layers; and
a trimming insulating block arranged in the interface area of the substrate and connected to an end of the first word line and an end of the second word line.

14. The semiconductor device of claim 13, wherein the first word line comprises:
a main extension portion arranged in the cell array area and extending in the second horizontal direction; and
a bending portion arranged in the interface area, connected to the main extension portion, and extending in the first horizontal direction,
wherein the main extension portion and the bending portion of the first word line contact the trimming insulating block,
wherein the second word line comprises a main extension portion arranged in the cell array area and extending in the second horizontal direction, and
wherein the main extension portion of the second word line contacts the trimming insulating block.

15. The semiconductor device of claim 14, further comprising a word line contact arranged in the interface area and arranged on the bending portion of the first word line.

16. The semiconductor device of claim 14,
wherein an upper surface of the trimming insulating block is at a level higher than an upper surface of the plurality of word lines, and
wherein a bottom surface of the trimming insulating block is at a level equal to or lower than a bottom surface of the plurality of word lines.

17. The semiconductor device of claim 14, further comprising:
a mold insulating layer arranged on the plurality of bit lines, the mold insulating layer including a plurality of openings extending in the second horizontal direction,
wherein the first word line is arranged on a first sidewall of each of the plurality of openings, and the second word line is arranged on a second sidewall of each of the plurality of openings.

18. The semiconductor device of claim 17,
wherein the trimming insulating block extends in the first horizontal direction, and
wherein the trimming insulating block crosses at least two of the plurality of openings arranged in the first horizontal direction.

19. The semiconductor device of claim 17,
wherein the trimming insulating block is formed in plural, and
wherein each of the trimming insulating blocks vertically overlaps one of the plurality of openings arranged in the first horizontal direction.

20. A semiconductor device comprising:
a substrate including a cell array area, a periphery circuit area, and an interface area between the cell array area and the periphery circuit area;
a periphery circuit arranged in the cell array area of the substrate;
a plurality of bit lines arranged in the cell array area of the substrate and extending in a first horizontal direction;
a mold insulating layer arranged on the plurality of bit lines, the mold insulating layer including a plurality of openings extending in a second horizontal direction;
a plurality of channel layers respectively arranged on the plurality of bit lines in each of the plurality of openings of the mold insulating layer;
a plurality of word lines arranged on the plurality of channel layers and extending in the second horizontal direction from the cell array area to the interface area, the plurality of word lines including a first word line arranged on a first sidewall of each opening of the mold insulating layer and a second word line arranged on a second sidewall of the opening of the mold insulating layer;
a trimming insulating block arranged in the interface area of the substrate and connected to an end of the first word line and an end of the second word line;
landing pads respectively arranged on the plurality of channel layers in the cell array area;
word line contacts arranged on end portions of the plurality of word lines in the interface area; and a routing wiring line arranged on the word line contact in the interface area, and arranged at a same vertical level as the landing pads.

\* \* \* \* \*